United States Patent
Asano et al.

(10) Patent No.: US 9,736,438 B2
(45) Date of Patent: Aug. 15, 2017

(54) SOLID STATE IMAGING DEVICE AND IMAGING DEVICE AND DRIVING METHOD THEREOF

(71) Applicant: Panasonic Intellectual Property Management Co., Ltd., Osaka (JP)

(72) Inventors: Takuya Asano, Hyogo (JP); Sei Suzuki, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 46 days.

(21) Appl. No.: 14/988,846

(22) Filed: Jan. 6, 2016

(65) Prior Publication Data
US 2016/0119594 A1 Apr. 28, 2016

Related U.S. Application Data

(63) Continuation of application No. PCT/JP2014/003028, filed on Jun. 6, 2014.

(30) Foreign Application Priority Data

Jul. 23, 2013 (JP) .................................. 2013-152653

(51) Int. Cl.
H04N 9/04 (2006.01)
G01S 17/89 (2006.01)
(Continued)

(52) U.S. Cl.
CPC .......... *H04N 9/045* (2013.01); *G01S 7/4861* (2013.01); *G01S 17/42* (2013.01); *G01S 17/89* (2013.01);
(Continued)

(58) Field of Classification Search
CPC .......... H04N 9/045; H04N 5/332; H04N 5/33; H04N 5/2226; H04N 5/2256;
(Continued)

(56) References Cited

U.S. PATENT DOCUMENTS

| | | | | | |
|---|---|---|---|---|---|
| 7,477,361 | B2* | 1/2009 | Murayama | ............... | G01C 3/08 |
| | | | | | 348/246 |
| 8,553,089 | B2* | 10/2013 | Noguchi | ................ | H04N 5/332 |
| | | | | | 348/162 |

(Continued)

FOREIGN PATENT DOCUMENTS

| | | |
|---|---|---|
| JP | 2008-005213 | 1/2008 |
| JP | 2008-008700 | 1/2008 |
| WO | 2013/027340 | 2/2013 |

OTHER PUBLICATIONS

International Search Report of PCT application No. PCT/JP2014/003028 dated Jul. 15, 2014.

*Primary Examiner* — Michael Osinski
(74) *Attorney, Agent, or Firm* — McDermott Will & Emery LLP

(57) ABSTRACT

Provided is an a imaging device that acquires a distance image excluding influence of background light in one frame scanning period and acquires a visible image in a separate frame from a single imaging sensor, and includes an infrared light source that emits infrared light, and a solid state imaging device including a plurality of first pixels and a plurality of second pixels, which respectively include vertical overflow drains, and are arranged in a matrix on a semiconductor substrate, the plurality of first pixels converting the infrared light into signal charges, and the plurality of second pixels converting visible light into signal charges. The solid state imaging device outputs a first signal obtained from the plurality of first pixels in an irradiation period of infrared light, and a second signal obtained from the plu- (Continued)

rality of first pixels in a non-irradiation period of infrared light, in a first frame scanning period, and outputs a third signal obtained from the plurality of first pixels and a fourth signal obtained from the plurality of second pixels, in a second frame scanning period.

14 Claims, 28 Drawing Sheets

(51) Int. Cl.
      *H01L 27/148*     (2006.01)
      *H04N 5/3728*    (2011.01)
      *H04N 5/359*     (2011.01)
      *G01S 17/42*      (2006.01)
      *G01S 7/486*      (2006.01)
      *H04N 5/33*       (2006.01)
      *H04N 5/341*     (2011.01)
      *H04N 5/361*     (2011.01)
      *H04N 13/02*     (2006.01)

(52) U.S. Cl.
      CPC .. *H01L 27/14843* (2013.01); *H01L 27/14887* (2013.01); *H04N 5/33* (2013.01); *H04N 5/341* (2013.01); *H04N 5/3592* (2013.01); *H04N 5/361* (2013.01); *H04N 5/3728* (2013.01); *G06T 2200/04* (2013.01); *G06T 2207/10024* (2013.01); *G06T 2207/10048* (2013.01); *G06T 2207/20182* (2013.01); *H04N 13/0271* (2013.01)

(58) Field of Classification Search
      CPC ............... H04N 5/2354; H04N 5/3537; H04N 5/35545; H04N 5/35572; H01L 27/14621; H01L 27/14612; H01L 27/14645; H01L 27/14649; G01C 3/08; G06T 2207/10048
      See application file for complete search history.

(56) References Cited

U.S. PATENT DOCUMENTS

| | | | |
|---|---|---|---|
| 8,854,471 B2 * | 10/2014 | Kang | G01S 17/02 250/330 |
| 9,046,358 B2 * | 6/2015 | Lee | H01J 40/14 |
| 9,425,233 B2 * | 8/2016 | Wan | G01S 7/4914 |
| 9,438,836 B2 * | 9/2016 | Tashiro | H04N 5/3532 |
| 2003/0063185 A1 * | 4/2003 | Bell | G01S 17/023 348/46 |
| 2006/0261280 A1 * | 11/2006 | Oon | H04N 5/2256 250/370.08 |
| 2008/0043218 A1 * | 2/2008 | Murayama | G01C 3/08 356/5.04 |
| 2008/0122933 A1 | 5/2008 | Murayama | |
| 2008/0211916 A1 * | 9/2008 | Ono | G08B 13/19608 348/164 |
| 2008/0283729 A1 * | 11/2008 | Hosaka | H04N 5/332 250/208.1 |
| 2010/0020209 A1 * | 1/2010 | Kim | H04N 3/155 348/294 |
| 2011/0169984 A1 * | 7/2011 | Noguchi | H04N 5/332 348/234 |
| 2012/0236121 A1 * | 9/2012 | Park | H04N 13/0271 348/46 |
| 2013/0002882 A1 * | 1/2013 | Onozawa | H04N 5/2353 348/164 |
| 2013/0181119 A1 * | 7/2013 | Bikumandla | H01L 27/14612 250/214.1 |
| 2014/0333814 A1 * | 11/2014 | Tashiro | H01L 27/14621 348/308 |
| 2015/0092019 A1 * | 4/2015 | Asano | G01C 3/085 348/46 |
| 2015/0130978 A1 * | 5/2015 | Tashiro | H04N 5/3532 348/311 |
| 2015/0304631 A1 * | 10/2015 | Lee | H04N 13/0239 348/46 |
| 2015/0341573 A1 * | 11/2015 | Matsuo | H04N 5/33 348/135 |
| 2015/0381963 A1 * | 12/2015 | Dal Mutto | G06T 5/50 348/46 |
| 2016/0181298 A1 * | 6/2016 | Wan | H01L 27/14603 348/164 |
| 2016/0198103 A1 * | 7/2016 | Tanaka | G03B 15/05 348/164 |
| 2016/0227194 A1 * | 8/2016 | Kim | G01S 17/023 |
| 2016/0255286 A1 * | 9/2016 | Tsukada | H04N 5/332 348/162 |
| 2016/0365376 A1 * | 12/2016 | Tashiro | H01L 27/14621 |

* cited by examiner

SOLID STATE IMAGING DEVICE AND IMAGING DEVICE AND DRIVING METHOD THEREOF

BACKGROUND OF THE INVENTION

1. Field of the Invention

The present disclosure relates to an imaging device that acquires an image (distance image) of an object present in a position away from a predetermined distance, and in particular, relates to an imaging device that acquires a distance image and a normal image (visible light image), and a driving method thereof.

2. Description of the Related Art

In the related art, for example, a ranging camera (motion camera) that emits infrared light to an imaging target space and detects the movement of the body or the hand of an object (person) is mounted in a television, a game machine, or the like, and an imaging device that acquires a distance image used in the ranging camera, in other words, a so-called distance measuring sensor has been known.

It is useful for the distance measuring sensor to acquire the distance image and a normal visible light image at the same time, in terms of cut-out of a specific object from an image (background separation) or preparation of a three-dimensional image.

In PTL 1, a distance image and a visible light image are acquired at the same time by a single solid state imaging device. Specifically, the solid state imaging device, which is made of a single plate and is capable of performing imaging using visible light and infrared (IR) light, emits IR pulses to an imaging target space at each one frame scanning period, while performing the imaging using the visible light and the infrared light at each one frame scanning period. The solid state imaging device generates a visible light image at each one frame scanning period, and generates a distance image excluding the influence of background light in each one frame scanning period, by subtracting an IR pixel signal obtained by performing imaging during non-irradiation of the IR pulses, from an IR pixel signal obtained by performing imaging during irradiation of the IR pulses.

CITATION LIST

Patent Literature

PTL 1: Japanese Patent Unexamined Publication No. 2008-8700

However, since the solid state imaging device generates the distance image excluding the influence of background light by using a plurality of frames, when an object moves between one frame and the subsequent frame, an error occurs in the distance image. Further, since a lateral overflow drain is provided, a region of a dark n layer and a control electrode are required and occupy a large area of the pixel, resulting in an increase in an exposure time due to a decrease in sensitivity caused by a decrease in a photodiode region, or a deterioration in distance measurement accuracy due to a decrease in a vertical transfer unit.

The present disclosure has been made in view of the above problems, and an object of the present disclosure is to provide an imaging device capable of acquiring a distance image excluding the influence of background light by using a single image sensor in one frame scanning period, and also acquiring a visible image in a separate frame, and a driving method thereof.

SUMMARY OF THE INVENTION

In order to achieve the object, an imaging device according to an aspect of the present disclosure includes an infrared light source that emits infrared light, and a solid state imaging device including a plurality of first pixels and a plurality of second pixels, which respectively include vertical overflow drains, and are arranged in a matrix on a semiconductor substrate, the plurality of first pixels converting the infrared light into signal charges, and the plurality of second pixels converting visible light into signal charges, in which the solid state imaging device outputs a first signal obtained from the plurality of first pixels in an irradiation period of infrared light, and a second signal obtained from the plurality of first pixels in a non-irradiation period of infrared light, in a first frame scanning period, and in which the solid state imaging device outputs a third signal obtained from the plurality of first pixels and a fourth signal obtained from the plurality of second pixels, in a second frame scanning period.

According to the aspect, since a signal for generating the distance image excluding the influence of background light is obtained in one frame scanning period, it is possible to improve the accuracy of distance information of a moving object.

Further, a visible light image is obtained in the subsequent frame scanning period, preferably, infrared light components mixed in the output obtained from the second pixel are removed by subtracting the output obtained from the first pixel from the signals obtained from the second pixel. This makes it possible to improve color reproducibility of the visible light image.

According to the present disclosure, since the distance image excluding the influence of the background light is obtained in one frame scanning period, it is possible to improve distance accuracy of a moving object, and the lateral overflow drain is not required, resulting in an improvement in the distance measurement accuracy, due to a sensitivity improvement by expanding the photodiode region, or due to an increase in the charge amounts to be treated by widening a vertical transfer unit.

Moreover, it is possible to suppress, for example, the output of the infrared light source that irradiates light, or to shorten the exposure time for irradiating the infrared light, due to the sensitivity improvement, thereby suppressing power consumption of the entire system.

Since a special structure is not required, it is possible to realize an imaging device by a general manufacturing method of an image sensor.

DETAILED DESCRIPTION OF THE PREFERRED EMBODIMENTS

Figure 1:
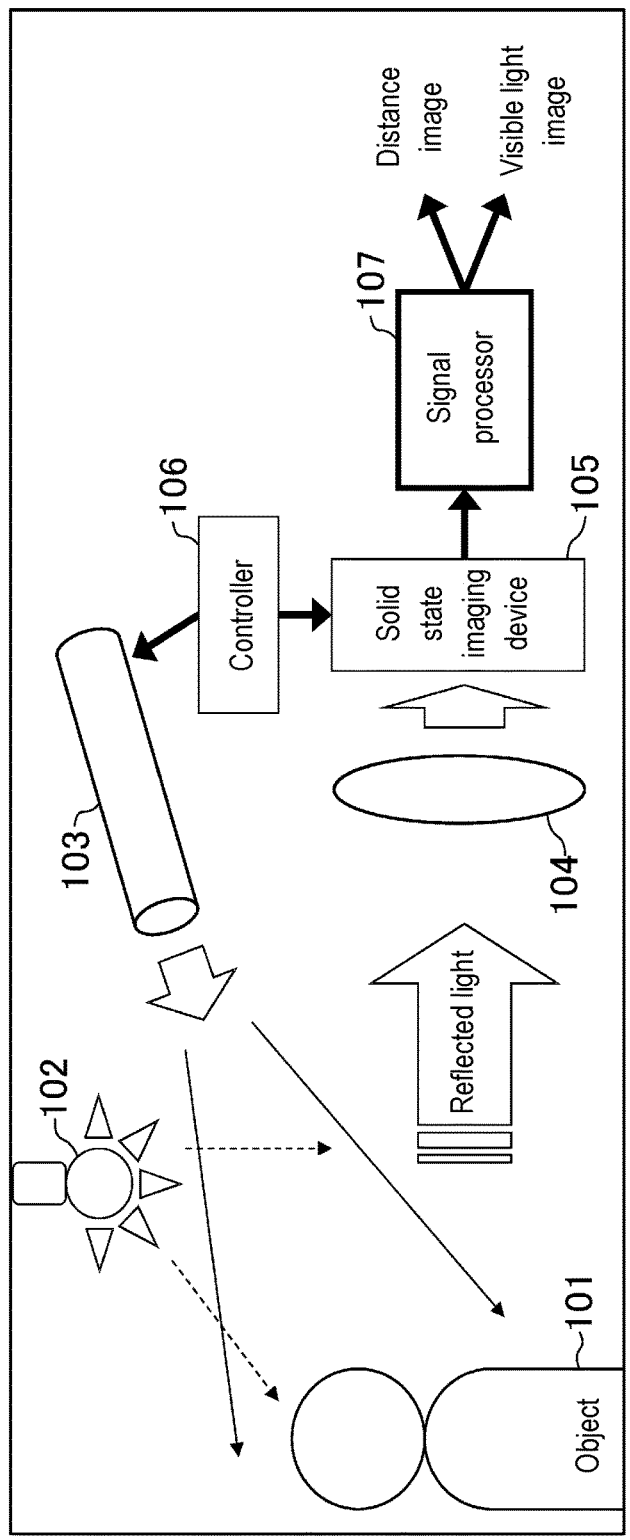
FIG. 1 is a block diagram illustrating a configuration example of a distance measurement system using an imaging device according to the present disclosure.

Hereinafter, embodiments of the present disclosure will be described with reference to the drawings. Although the description has been made with reference to the accompanying drawings, it is for illustrative purposes, and is not intended to limit the disclosure thereto. The elements representing substantially the same structure, operation, and effect in the drawings are denoted by the same reference numerals.

FIG. 1 is a block diagram illustrating a configuration example of a distance measurement system using an imaging device according to the present disclosure. As illustrated in FIG. 1, object 101 is located in an imaging target space where there is illumination including visible light and infrared light from background light source 102. The imaging device includes infrared light source 103, lens 104, solid state imaging device 105, controller 106, and signal processor 107, and constitutes a distance measurement system employing any one of a well-known variety of infrared systems such as a time of flight (TOF) type, a structured light type, and a stereo type.

Infrared light source 103 irradiates object 101 with, for example, infrared laser light of a wavelength of 850 nm. Background light and infrared laser light are reflected by object 101, incident on lens 104, and focused on solid state imaging device 105. Solid state imaging device 105 includes a plurality of first pixels converting the infrared light into signal charges, and a plurality of second pixels converting the visible light into signal charges, which are arranged in a matrix on a semiconductor substrate. Controller 106 controls infrared light source 103 and solid state imaging device 105 so as to synchronize each other. Signal processor 107 generates a distance image signal based on the infrared laser light and a visible light image signal, from the output of solid state imaging device 105.

In addition, any optical filter (for example, a band pass filter that passes only a visible light wavelength region and a certain near-infrared wavelength band), not illustrated, may be provided between lens 104 and solid state imaging device 105.

Hereinafter, various specific examples of solid state imaging device 105 in FIG. 1 will be described.

In all of the embodiments, a description will be made regarding a case where all of solid state imaging devices 105 are charge coupled device (CCD) image sensors and the distance measurement system is a TOF type.

First Embodiment

Figure 2:
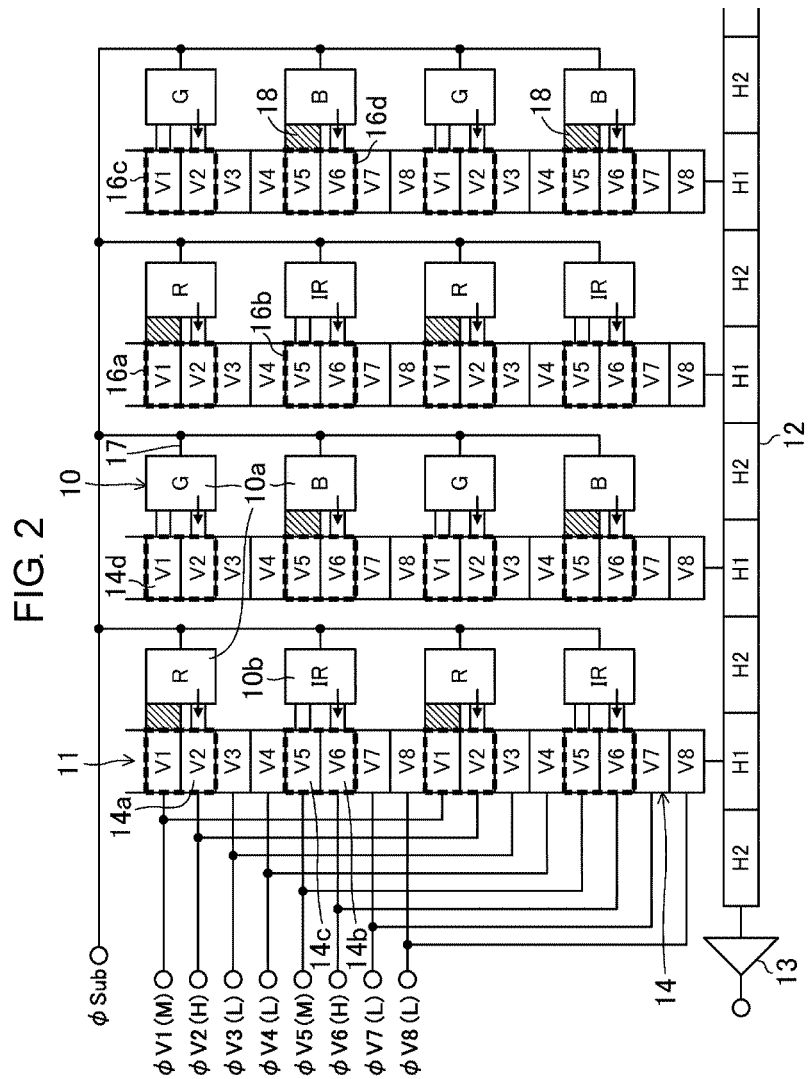
FIG. 2 is a plan view illustrating a first embodiment of a solid state imaging device in FIG. 1.
Figure 3:
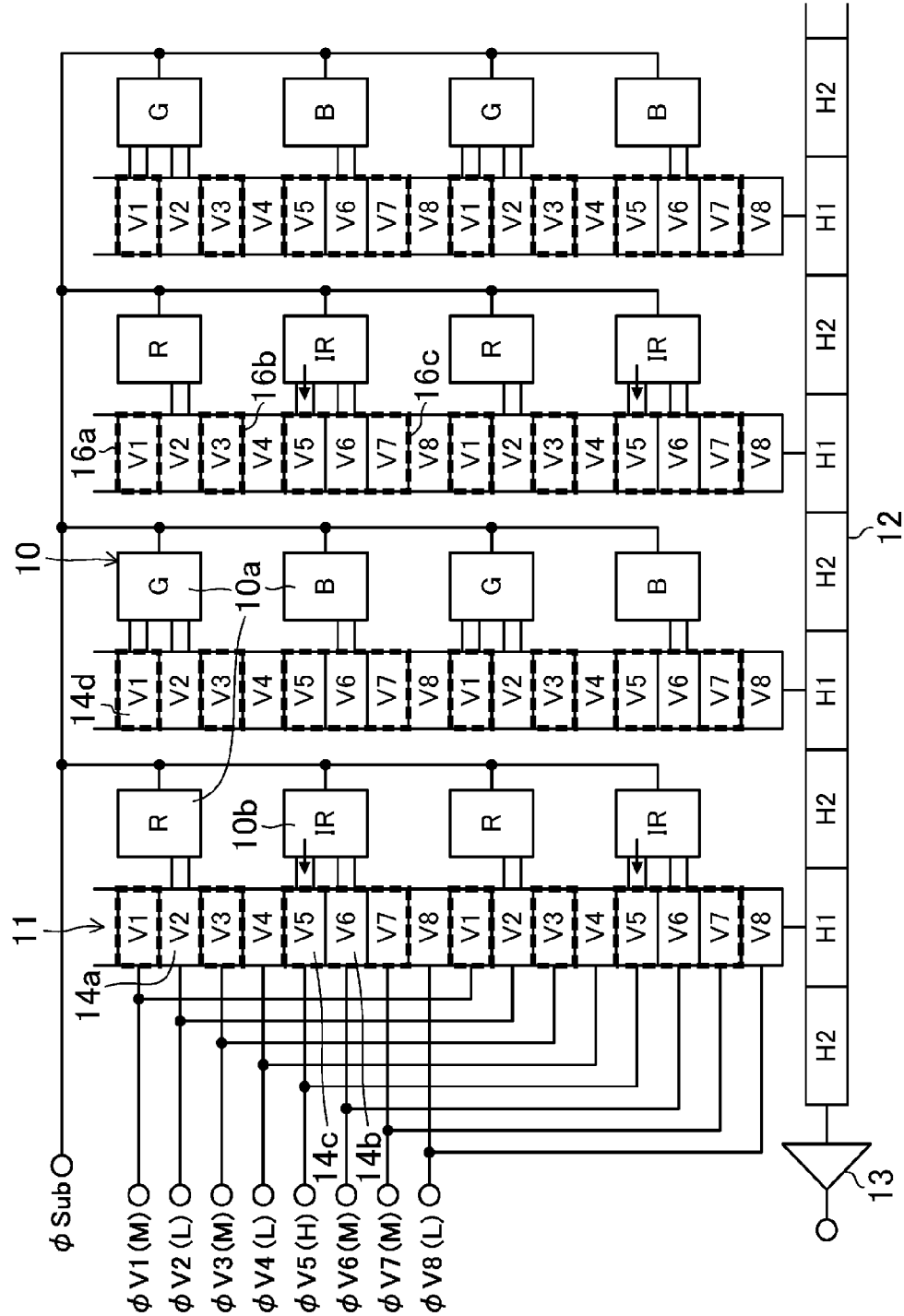
FIG. 3 is another plan view illustrating the first embodiment of the solid state imaging device in FIG. 1.

FIG. 2 and FIG. 3 are plan views illustrating a first embodiment of solid state imaging device 105 in FIG. 1.

The solid state imaging device illustrated in FIG. 2 and FIG. 3 includes a plurality of photoelectric conversion units 10 which are arranged in a matrix on a semiconductor substrate. These photoelectric conversion units 10 are classified into a plurality of photoelectric conversion units 10a converting visible light into signal charges, and a plurality of photoelectric conversion units 10b converting infrared light into signal charges. Each visible light photoelectric conversion unit 10a includes filters that selectively transmit red (R), green (G), and blue (B). Each infrared light photoelectric conversion unit 10b includes a filter that selectively transmits infrared (IR) light.

The solid state imaging device of FIG. 2 includes vertical transfer unit 11 that transfers the signal charges read from photoelectric conversion units 10a and 10b in a column direction, horizontal transfer unit 12 that transfers the signal charges transferred by vertical transfer unit 11 in a row direction (horizontal direction), charge detection unit 13 that amplifies and outputs the signal charges transferred by horizontal transfer unit 12, first read electrodes 14a and 14b which are provided corresponding to the respective photoelectric conversion units 10 of all pixels and from which the signal charges can be read to vertical transfer unit 11 at the same time, and second read electrodes 14c and 14d that are provided corresponding to the respective photoelectric conversion units 10 of all pixels and from which the signal charges can be read selectively from at least infrared light photoelectric conversion unit 10b to vertical transfer unit 11.

In addition, in the present embodiment, for example, second read electrode 14c is spread around pixels of each line in order to selectively read a signal from a certain pixel, but channel stop region 18 is provided such that a signal is not to be read from pixels other than the pixel that is read by photoelectric conversion unit 10b. Similarly, one second read electrode 14d is configured to selectively read signal charges from a certain photoelectric conversion unit, by using channel stop region 18.

Here, the solid state imaging device is an inter-line transfer type CCD corresponding to reading of all pixels (progressive scanning), and for example, vertical transfer unit 11 is eight-phase (($\phi$V1 to $\phi$V8) driven of two pixel periods, in which vertical transfer electrode 14 has four gates per one pixel, and horizontal transfer unit 12 is two-phase ($\phi$H1, $\phi$H2) driven. In vertical transfer unit 11, the signal charges accumulated in photoelectric conversion units 10a and 10b are respectively and separately read to, for example, signal packets 16a to 16d indicated by dotted lines in vertical transfer unit 11, and after the signal charges are transferred to vertical transfer unit 11 in a downward direction in FIG. 2, the signal charges are transferred and output to horizontal transfer unit 12 in a left direction in FIG. 2.

Further, a vertical overflow drain (VOD) is provided in each pixel. The VOD is configured in such a manner that the signal charges of all pixels are collectively discharged to the substrate, if a high voltage ($\phi$Sub pulse) is applied to VSBU electrode 17 connected to the substrate. Thus, since there is no element to reduce the area of a photodiode of each pixel and the area of the vertical transfer unit, such as a lateral overflow drain, it is possible to maintain high sensitivity.

As described in this embodiment, when vertical transfer unit 11 is eight-phase driven by providing second read electrode 14c from which signals can be read only from infrared light photoelectric conversion unit 10b, for example, as in FIG. 3, the signals accumulated in photoelectric conversion unit 10b are selectively read, that is, from a V5 gate in FIG. 3, and can be read separately to signal packets 16a to 16c indicated by dotted lines, a plurality of signals are obtained from one photoelectric conversion unit 10b, and background light can be subtracted from the distance signal.

In addition, channel stop region 18 illustrated in FIG. 2 is not illustrated hereinafter, also in FIG. 3, unless it is necessary for explanation.

Figure 4:
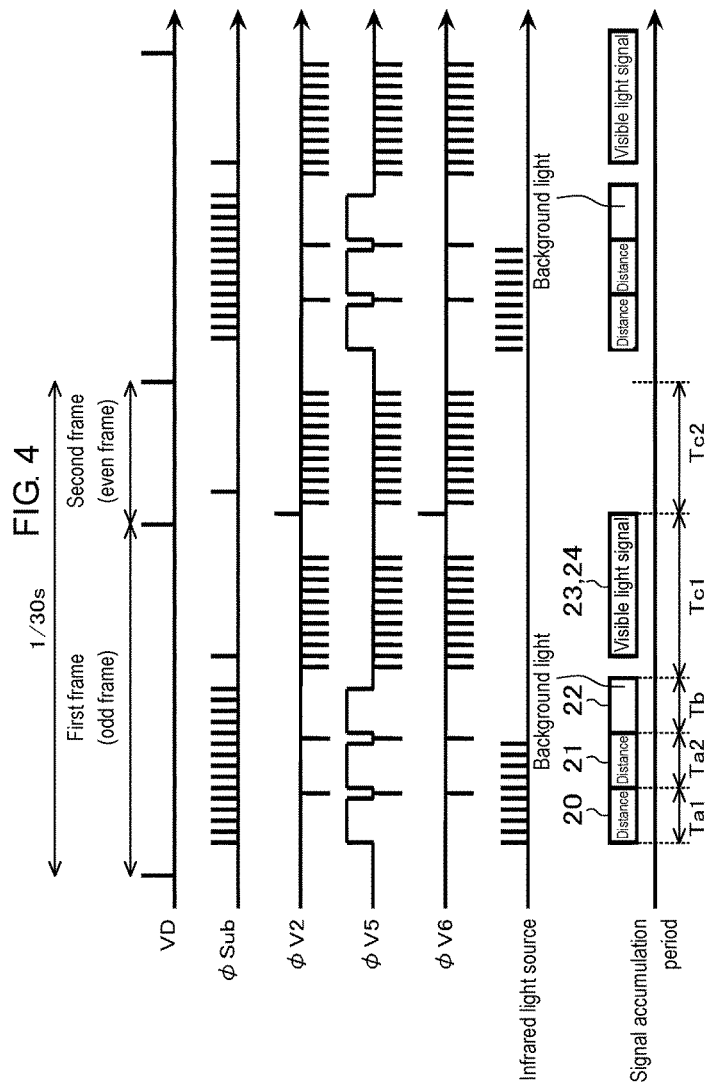
FIG. 4 is a timing chart illustrating a schematic operation of the solid state imaging device in FIG. 2.

FIG. 4 is a timing chart schematically illustrating the operation of the solid state imaging device of FIG. 2 and FIG. 3, and illustrates an example in which a signal for generating a distance image excluding the influence of background light is obtained in a first frame scanning period, and a visible light image is obtained in a second frame scanning period. Further, FIG. 5 to FIG. 8 are plan views each illustrating an operation at each timing of the solid state imaging device of FIG. 2 and FIG. 3.

With respect to a vertical synchronization pulse VD illustrated in FIG. 4, for example, there are 30 frames per second (30 fps) in 2VD. In one frame scanning period, distance signal 20, distance signal 21, and background light signal 22 are obtained, which are intended to generate a distance image excluding the influence of background light. In the subsequent frame scanning period, visible light signal 23 and visible light signal 24 are obtained, which are intended to generate a visible light image.

First, first distance signal accumulation period Ta1 is started at the beginning of an odd frame. In first distance signal accumulation period Ta1, distance signal 20 is read as illustrated in FIG. 5, by applying read pulse $\phi$V5 and emitting infrared light, and distance signal 20 is accumulated in signal packet 16a.

Figure 6:
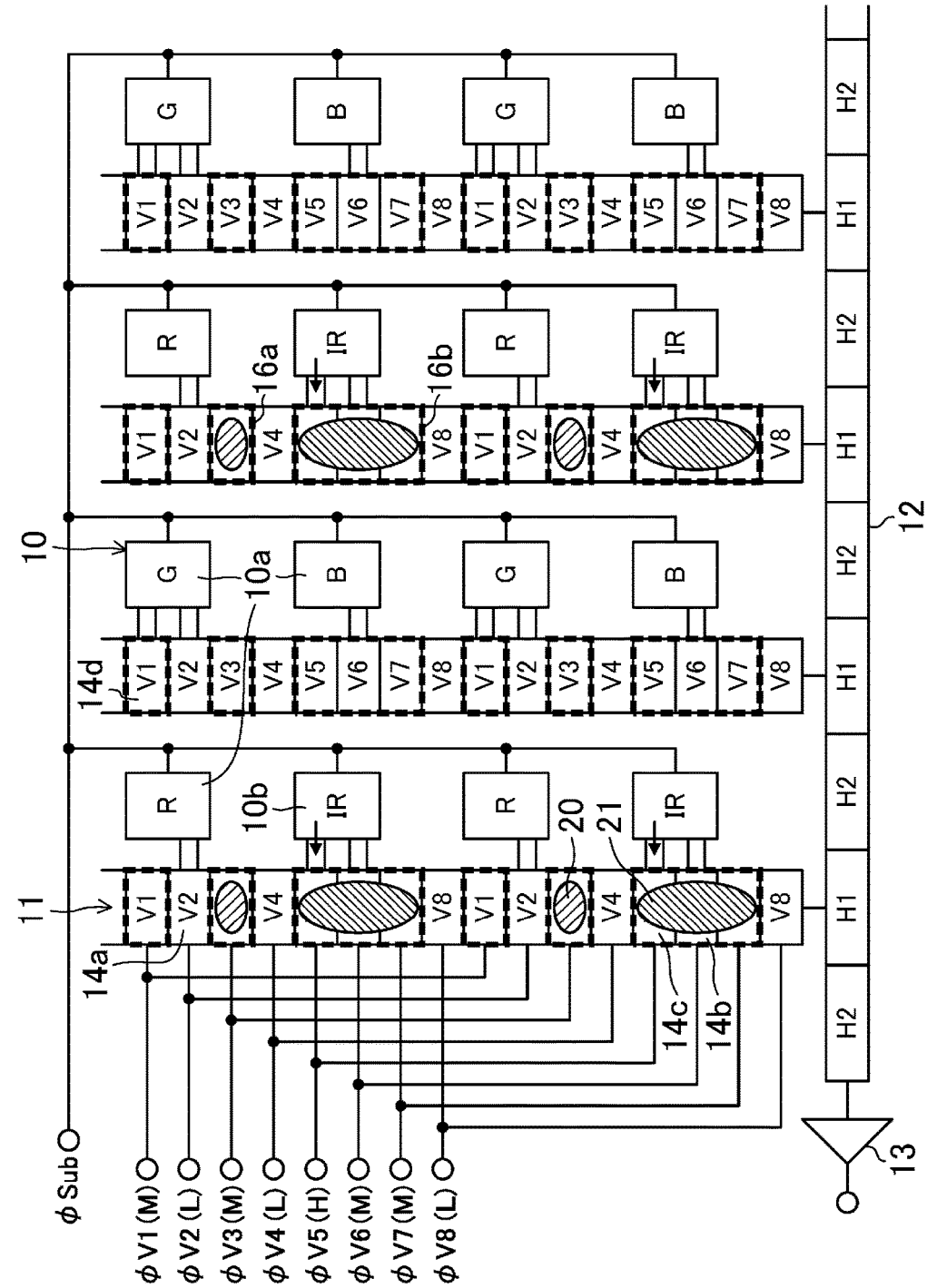
FIG. 6 is a plan view illustrating the operation of the solid state imaging device in FIG. 2 at the next timing.

If first distance signal accumulation period Ta1 is completed, as illustrated in FIG. 6, distance signal 20 is transferred in a reverse direction by one stage, and second distance signal accumulation period Ta2 is started. In second distance signal accumulation period Ta2, distance signal 21 is read by applying read pulse $\phi$V5 and emitting the infrared light, and distance signal 21 is accumulated in signal packet 16b.

Figure 7:
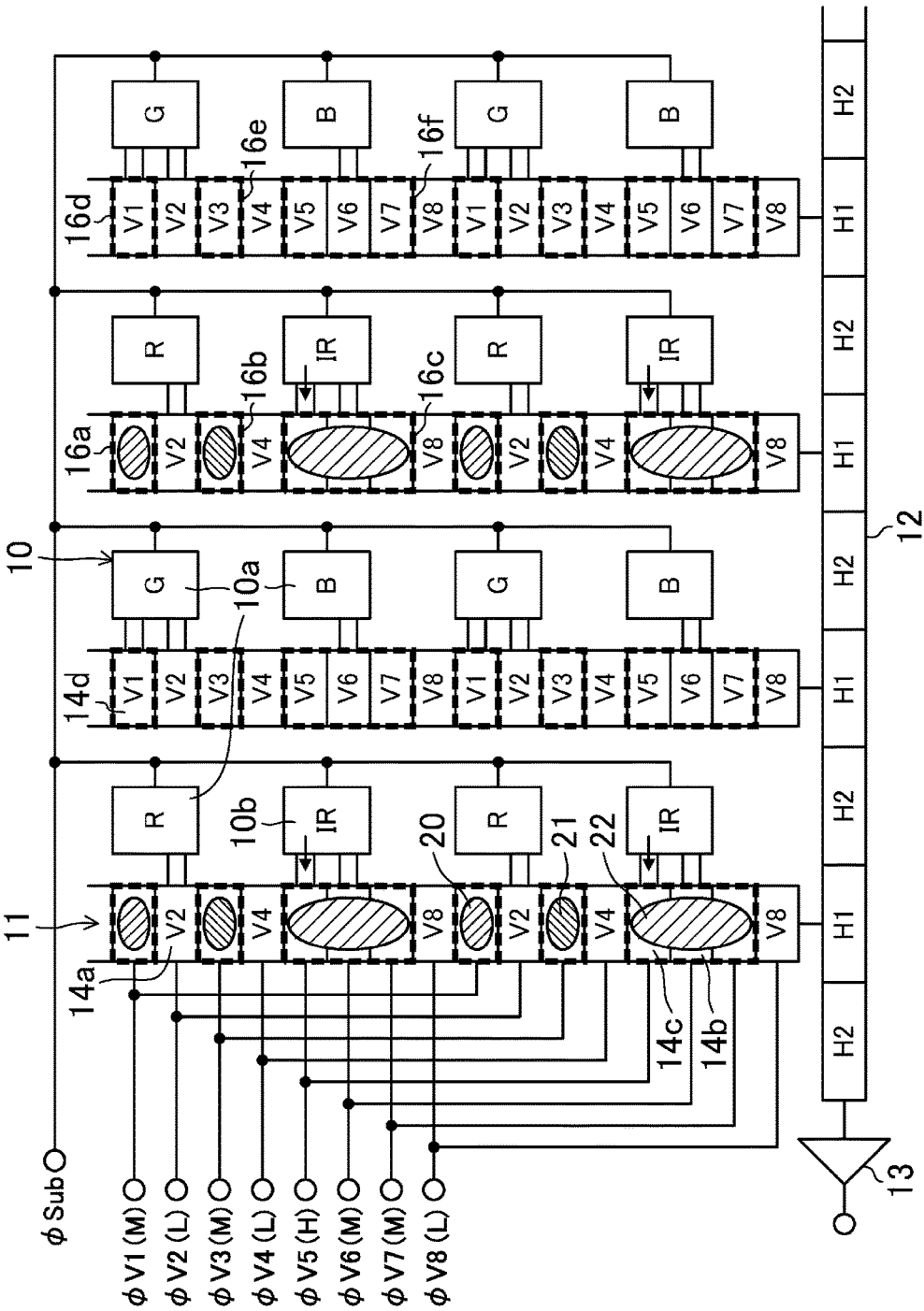
FIG. 7 is a plan view illustrating the operation of the solid state imaging device in FIG. 2 at another next timing.

If second distance signal accumulation period Ta2 is completed, as illustrated in FIG. 7, distance signal 20 and distance signal 21 as well as signal packets 16a and 16b are transferred in the reverse direction by one stage, and background light signal accumulation period Tb is started. In background light signal accumulation period Tb, after background light is exposed for a period of the same length as first distance signal accumulation period Ta1 and second distance signal accumulation period Ta2, background light signal 22 is read by applying read pulse $\phi$V5, without emitting the infrared light, and background light signal 22 is accumulated in signal packet 16e.

Figure 5:
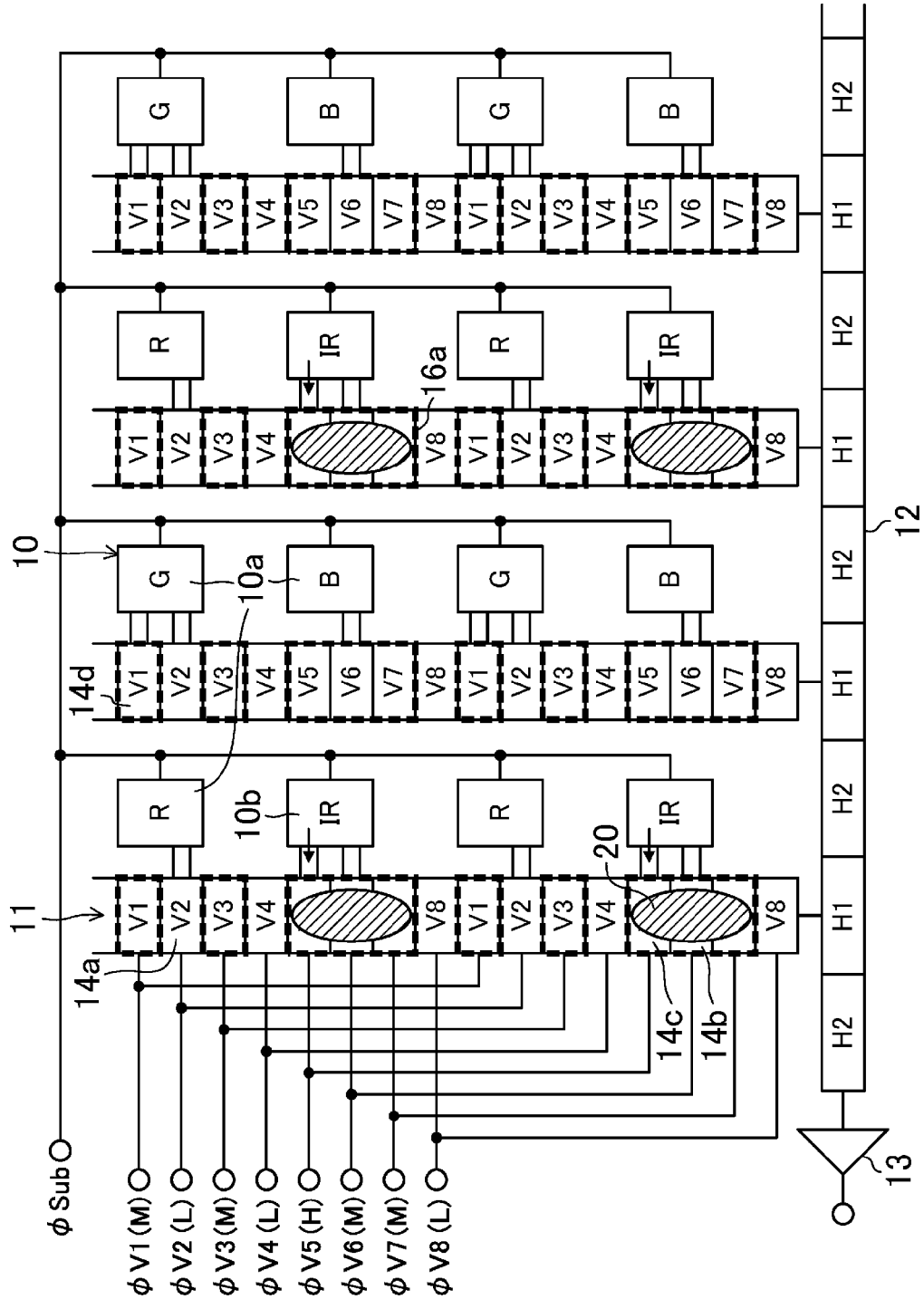
FIG. 5 is a plan view illustrating an operation of the solid state imaging device in FIG. 2 at a certain timing.

The operations of FIGS. 5 to 7 are performed once per frame in a timing chart of FIG. 4, for simplicity of explanation, but it is possible to improve the distance measurement accuracy of a moving object by repeating these series of operations of FIGS. 5 to 7 and accelerating the period of one cycle before output.

In signal transfer period Tc1, distance signal 20, distance signal 21, and background light signal 22 are sequentially output by sequentially scanning vertical transfer unit 11 and horizontal transfer unit 12.

In this case, the signal charges of all pixels are discharged by applying substrate discharge pulse $\phi$Sub at a certain timing. If the application of substrate discharge pulse $\phi$Sub is ended, visible light signal 23 of photoelectric conversion unit 10a and visible light signal 24 of photoelectric conversion unit 10b start to be accumulated in respective photoelectric conversion units.

Figure 8:
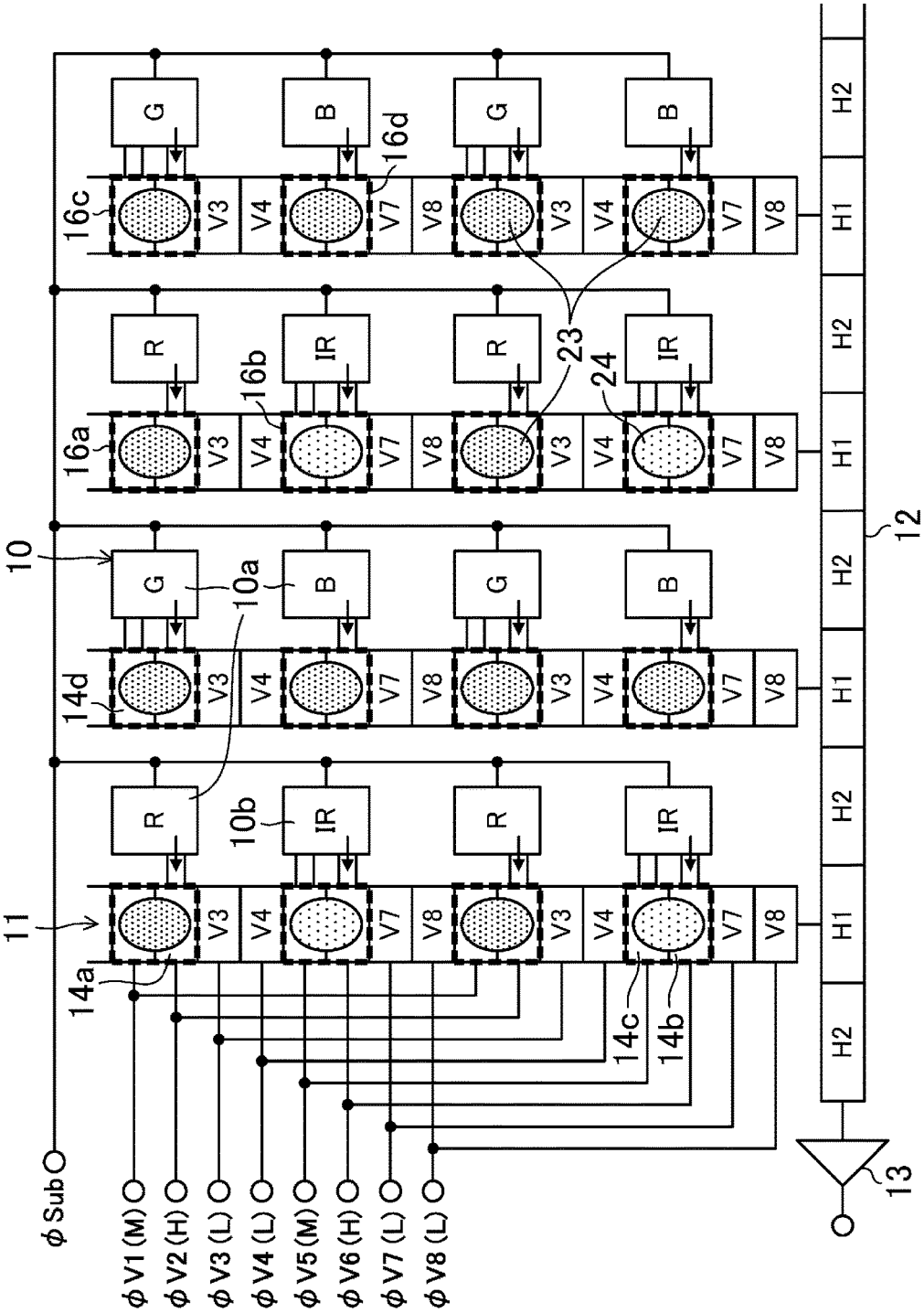
FIG. 8 is a plan view illustrating the operation of the solid state imaging device in FIG. 2 at still another next timing.

Next, visible light signal 23 and visible light signal 24 that have been accumulated by the exposure in the signal transfer period Tc1 in the previous frame are accumulated in signal packets 16a to 16d, by applying read pulses $\phi$V2 and $\phi$V6, at the beginning of an even frame, as illustrated in FIG. 8.

In signal transfer period Tc2, visible light signal 23 and visible light signal 24 are sequentially output by sequentially scanning vertical transfer unit 11 and horizontal transfer unit 12.

Figure 9:
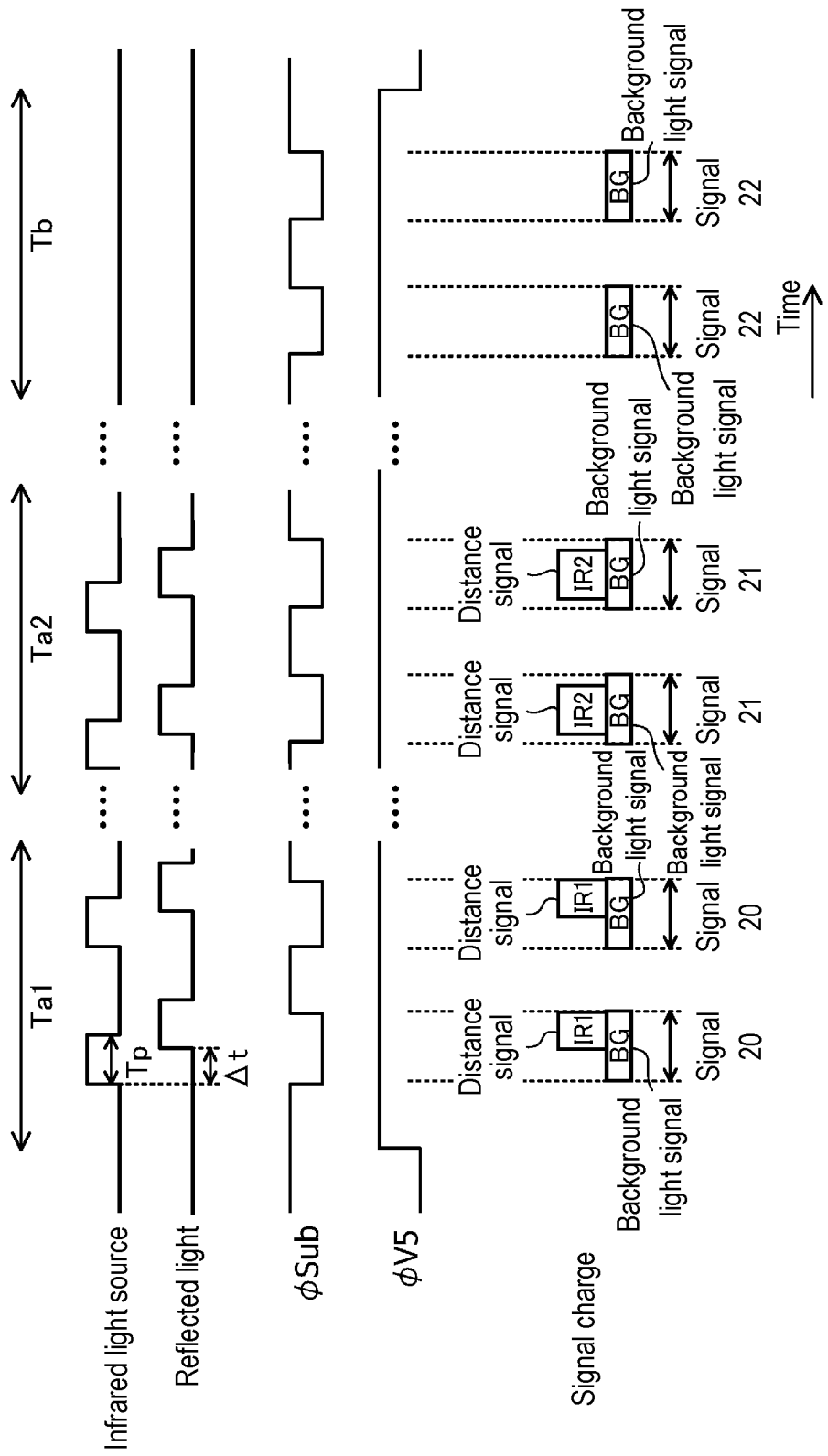
FIG. 9 is a timing chart illustrating a detailed operation of the solid state imaging device in FIG. 2 in a distance signal accumulation period.

FIG. 9 is a timing chart illustrating a detailed operation of the solid state imaging device of FIG. 4, in first distance signal accumulation period Ta1, second distance signal accumulation time Ta2, and background light signal accumulation period Tb.

In first and second distance signal accumulation periods Ta1, Ta2, and Tb, when read pulse $\phi$V5 applied to vertical transfer electrode 14c is fixed to a High level, and substrate discharge pulse $\phi$Sub becomes a Low level, charges are accumulated.

First, background light components contained in distance signal 20 and distance signal 21 are eliminated by using background light signal 22 in the generation of a distance image. For example, as illustrated in FIG. 9, if the amount of signal charges based on the reflected light that is ended at the falling time of an irradiation light pulse is set to IR1, the amount of signal charges that does not depend on the falling time is set to IR2, a distance to an object is set to z, and light velocity is set to c, it is established that $$z = c \times \Delta t / 2$$
$$= (c \times Tp/2) \times (\Delta t / Tp)$$
$$= (c \times Tp/2) \times (IR1/IR2).$$

Further, since infrared components contained in visible light signal 23 are also eliminated by using visible light signal 24 in the generation of a visible light image, it is possible to generate a visible light image having high color reproducibility.

As described above, according to a TOF-type distance measurement system according to the first embodiment, it is possible to obtain a distance image excluding the influence of the background light in one frame scanning period and to obtain a visible light image having high color reproducibility in a separate frame, by increasing the number of drive phases of vertical transfer unit 11 provided in solid state imaging device. In addition, providing a vertical overflow drain in each pixel enables sensitivity to be improved by expanding the area of photoelectric conversion unit 10, or enables the saturation signal amount of vertical transfer unit 11 to be increased by expanding the area of vertical transfer unit 11, such that distance measurement accuracy improvement is possible.

It is possible to suppress, for example, the output of the infrared light source that irradiates light, or to shorten the exposure time for irradiating the infrared light, due to the sensitivity improvement, resulting in suppressing power consumption of the entire system.

Moreover, in the case of performing driving suitable for the TOF system illustrated in the present embodiment, since pulse φSub for discharge of charges is applied to the substrate and transmitted to the entire pixel by the vertical overflow drain structure, it not necessary to apply a high voltage for discharging charges from the wiring layer on the pixel to each pixel as in the lateral overflow drain, such that the pulse is less likely to make a noise such as a dark current.

In addition, since the solid state imaging device of the present embodiment can be realized only by changing the number of drive phases, and adding a channel stop region which corresponds to a portion of the read electrode, as compared with the solid state imaging device in the related art, it is possible to realize the solid state imaging device without requiring a complicated manufacturing method.

It is necessary to obtain a dedicated signal from another frame to eliminate the infrared component included in visible light signal 23, and there is a problem in that the color reproducibility of the visible light image is reduced, in the related art, but visible light signal 23 and visible light signal 24 are obtained in the same frame and the infrared component can be eliminated according to the TOF distance measurement systems according to the first embodiment, such that a visible light image having high color reproducibility can be obtained.

In addition, in the present embodiment, since only the signals obtained from photoelectric conversion unit 10b are read out to vertical transfer unit 11 in the first frame, during operation, as illustrated in FIG. 7 there are signal packets 16d, 16e, and 16f in the adjacent vertical transfer units 11, but signals are not read out from photoelectric conversion unit 10a, such that the signal packets actually remain in empty packets.

Therefore, since signals 16a to 16c are also sequentially filled in free packets which are present in every other column, during the horizontal transfer, the number of odd frames can be shortened, and thus further improvement in the frame rate is possible.

Figure 10:
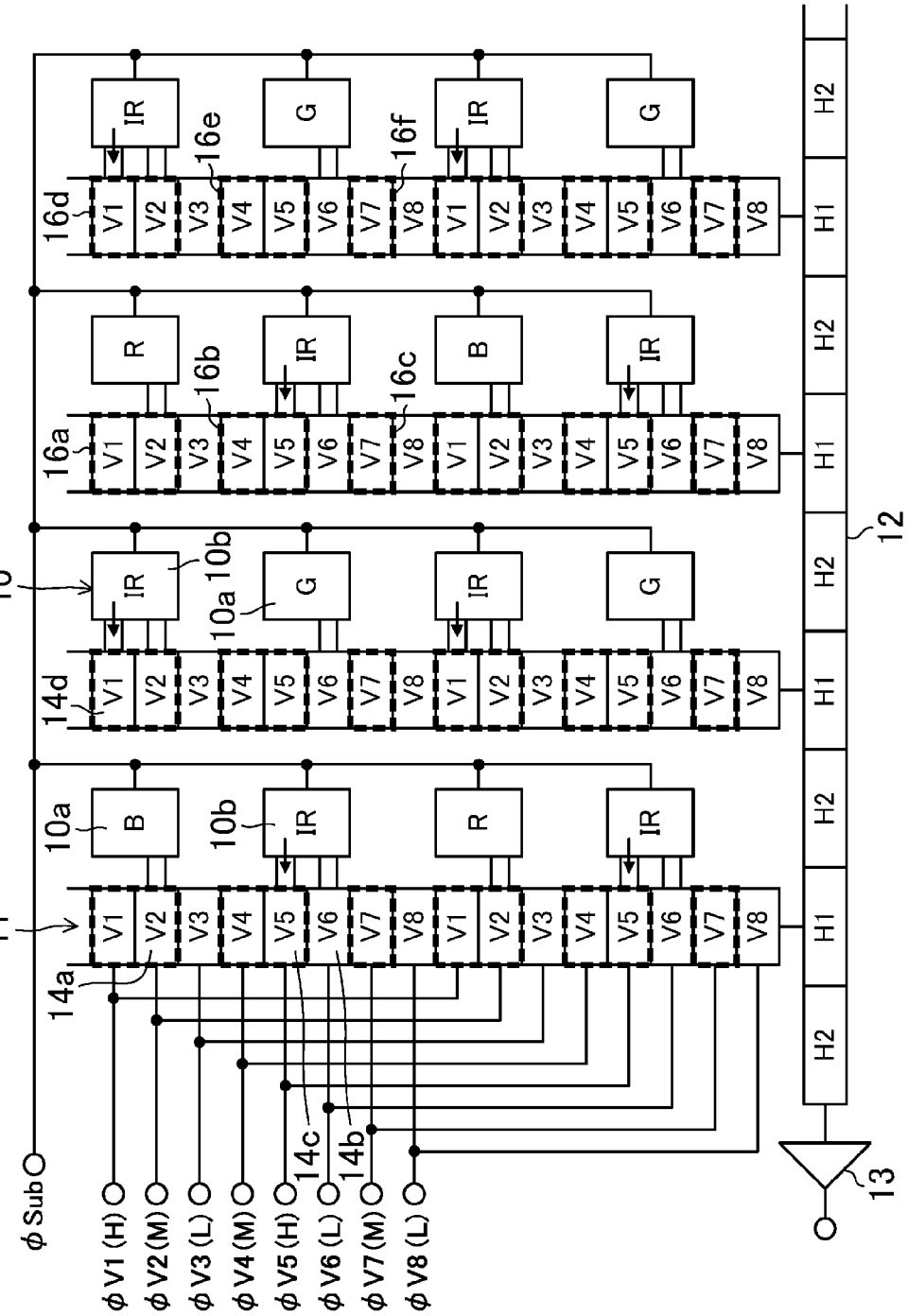
FIG. 10 is a plan view illustrating another filter arrangement example of the first embodiment of the solid state imaging device in FIG. 1.

In addition, for example, as illustrated in FIG. 10, when photoelectric conversion units 10b of infrared light are placed in a checkered pattern and photoelectric conversion units 10a of visible light are placed in other remaining pixels which are free in a checkered pattern, read pulses φV1 and φV5 are applied to second read electrodes 14c and 14d corresponding to photoelectric conversion units 10b of infrared light, such that there is an advantage that distance signals can be accumulated in not only the signal packets 16a to 16c, but also signal packets 16d to 16f, in the first frame scanning period, and the resolution of the distance image is increased, and thus in particular, the filter arrangement is effective when the resolution of the distance image is needed.

Second Embodiment

Figure 11:
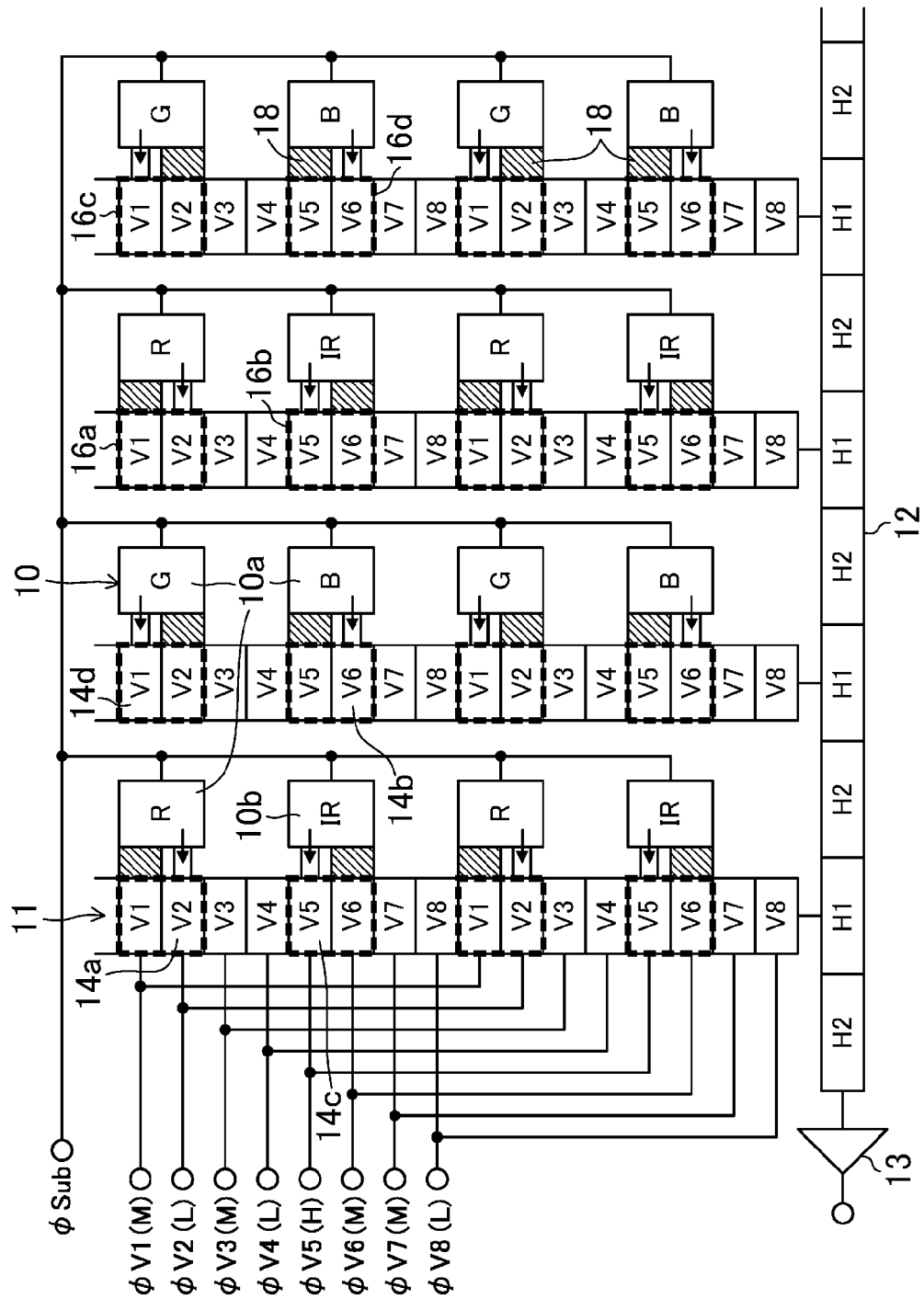
FIG. 11 is a plan view illustrating a second embodiment of the solid state imaging device in FIG. 1.

FIG. 11 is a plan view illustrating a second embodiment of solid state imaging device 105 in FIG. 1.

The solid state imaging device according to the second embodiment is different from the solid state imaging device according to the first embodiment in the configuration of vertical transfer unit 11. However, an object of providing a structure and a driving method capable of generating a distance image excluding influence of the background light in one frame scanning period, and obtaining a visible light image excluding infrared components in a separate frame is the same as in the solid state imaging device according to the first embodiment. Hereinafter, a description will be made focusing portions different from the first embodiment, and the description regarding the same portions will be omitted.

The solid state imaging device illustrated in FIG. 11 is adapted to be read out only in the checkerboard pattern such that read electrodes 14a and 14b are the same as read electrodes 14c and 14d, as compared to the solid state imaging device in FIG. 2 and FIG. 3, and for example, channel stop region 18 is provided in read electrode 14b corresponding to photoelectric conversion unit 10b of infrared light is adapted not to read a signal. Read electrode 14a is also the same.

In the case of the present embodiment, the operation is possible at approximately the same driving as in FIG. 4 illustrating the drive timing of the first embodiment, but the present embodiment is different from the first embodiment in that it is necessary to apply the read pulses that are applied at the beginning of the second frame scanning period not only at φV2 and φV6, but also at φV1 and φV5. In a specific operation, it is necessary to read visible light signal 23 and visible light signal 24 at the timing of FIG. 8 in the first embodiment not only by using read electrodes 14a and 14b but also by using read electrodes 14c and 14d. Other parts are not changed from the first embodiment.

However, according to this configuration, when acquiring for example, a visible light image, if only red is read, only blue is read, or only green is read, it becomes possible to read out only a specific color, and it is possible to increase the variations of the available visual image. Incidentally, when reading out only a specific color, a large number of free packets can be present, such that it is possible to shorten the signal output time by filling signals during the horizontal transfer.

As described above, according to the TOF-type distance measurement system according to the second embodiment, it is possible to increase the variation of the read image, that is, to increase the flexibility of the visible image, simply by adding channel stop region 18 to a part of read electrodes, from the solid state imaging device according to the first embodiment.

Similarly to the first embodiment, since the second embodiment can be realized simply by adding channel stop region 18 corresponding to a portion of the read electrodes, it is possible to realize the second embodiment, without requiring a complicated manufacturing method.

Moreover, the second embodiment is the same as the first embodiment in a fact in that the distance image excluding influence of the background light can be generated in one frame scanning period and the visible light image can be obtained in a separate frame, and a fact in it is possible to improve the distance measurement accuracy by increasing the frame rate by increasing the sensitivity, by providing the vertical overflow drain, or increasing the saturation signal amount of vertical transfer unit 11.

Third Embodiment

Figure 12:
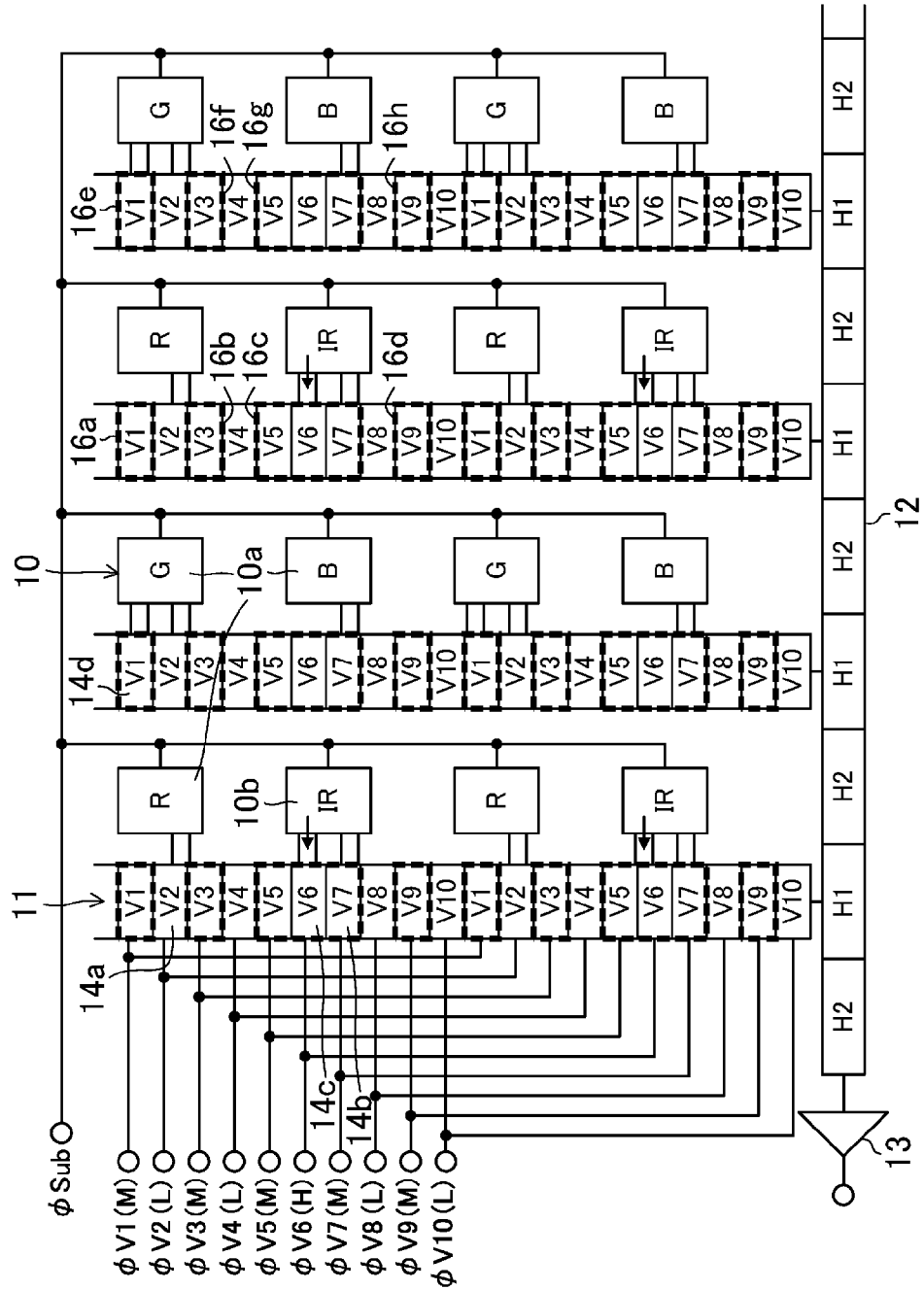
FIG. 12 is a plan view illustrating a third embodiment of the solid state imaging device in FIG. 1.

FIG. 12 is a plan view illustrating a third embodiment of solid state imaging device 105 in FIG. 1.

The solid state imaging device according to the third embodiment is different from the solid state imaging device according to the first embodiment in the configuration of vertical transfer unit 11. However, an object of providing a structure and a driving method capable of generating a distance image excluding influence of the background light in one frame scanning period, and obtaining a visible light image in a separate frame is the same as in the solid state imaging device according to the first embodiment. Hereinafter, a description will be made focusing portions different from the first embodiment, and the description regarding the same portions will be omitted.

In the solid state imaging device illustrated in FIG. 12, as compared to the solid state imaging device in FIG. 2 and FIG. 3, vertical transfer unit 11 has five gates of vertical transfer electrodes per one pixel, and is ten-phase ($\phi$V1 to $\phi$V10) driven of two-pixel period.

Figure 13:
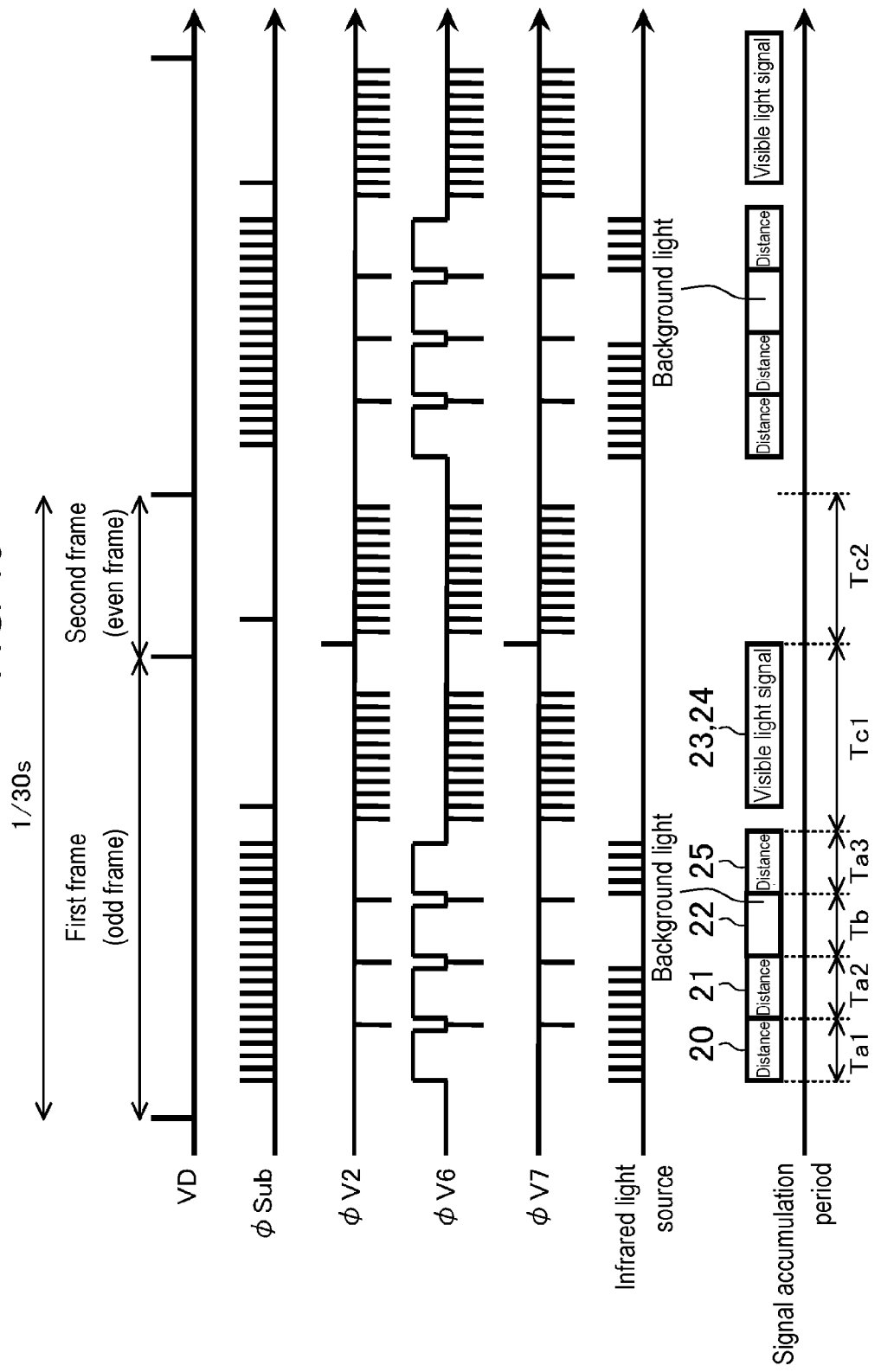
FIG. 13 is a timing chart illustrating a schematic operation of the solid state imaging device in FIG. 12.

FIG. 13 is a timing chart illustrating a schematic operation of the solid state imaging device in FIG. 12, and basically the same as FIG. 4 which is a timing chart illustrating a schematic operation of the solid state imaging device in FIG. 2 and FIG. 3, but has a difference in the number of drive phases, and thus electrodes to which read pulses are applied are different. Further, it is different in newly acquiring distance signal 25 in addition to the first embodiment.

FIGS. 14 to 18 are plan views illustrating an operation of the solid state imaging device in FIG. 12 at respective timings.

Figure 14:
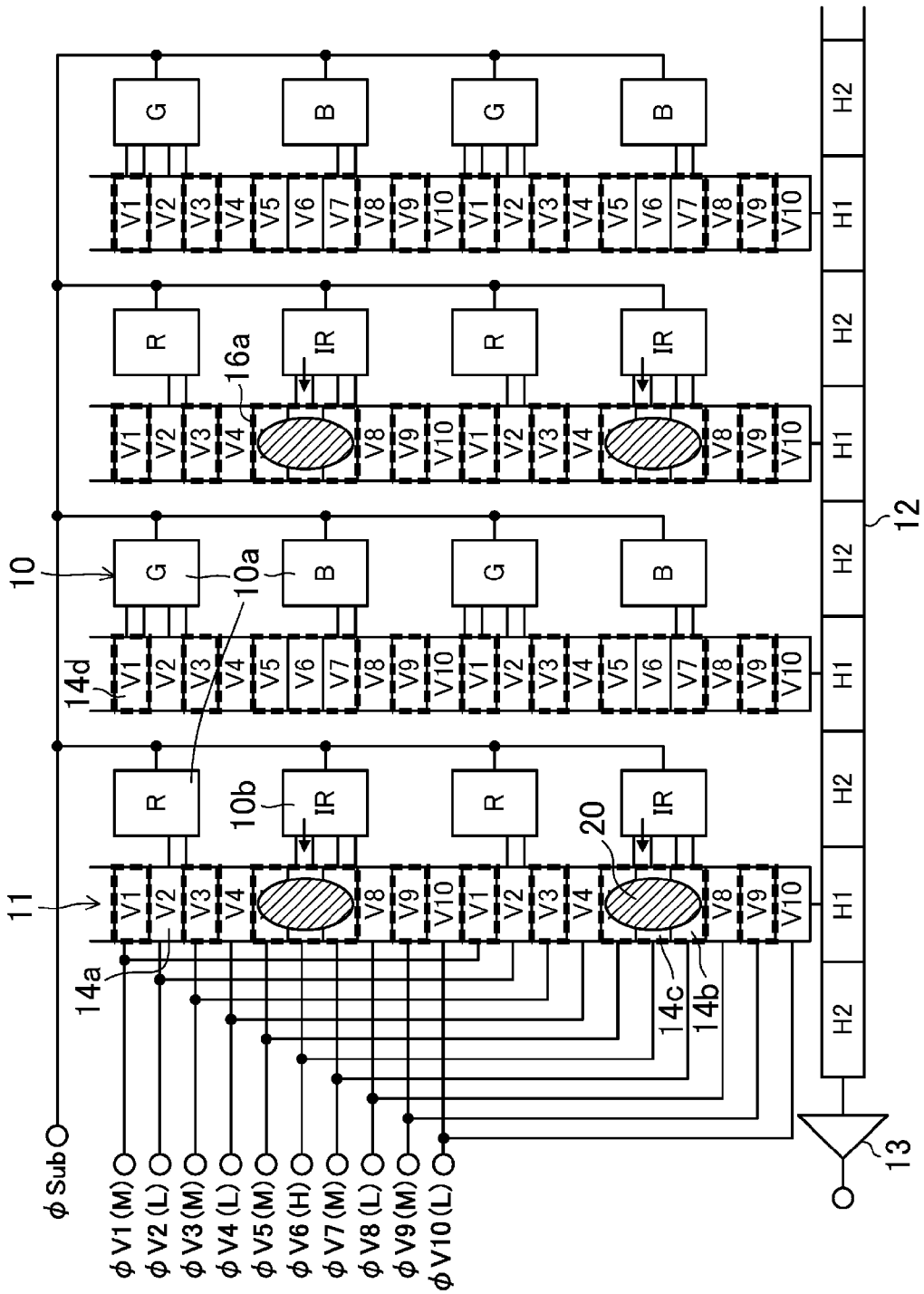
FIG. 14 is a plan view illustrating an operation of the solid state imaging device in FIG. 12 at a certain timing.

In FIG. 13, first, first distance signal accumulation period Ta1 is started at the beginning of an odd frame. In first distance signal accumulation period Ta1, distance signal 20 is read as illustrated in FIG. 14, by applying read pulse $\phi$V6 and emitting infrared light, and distance signal 20 is accumulated in signal packet 16a.

Figure 15:
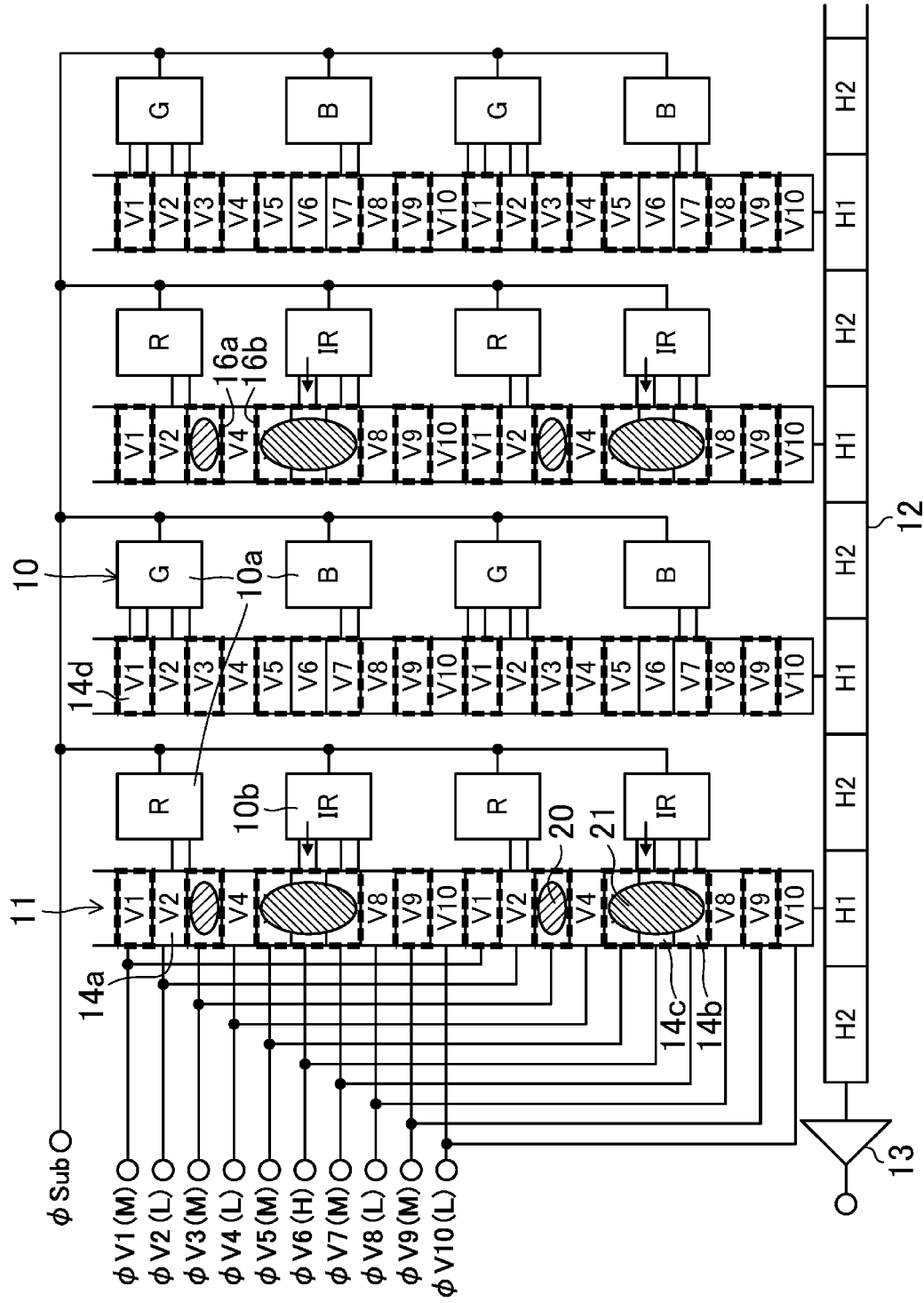
FIG. 15 is a plan view illustrating the operation of the solid state imaging device in FIG. 12 at the next timing.

If first distance signal accumulation period Ta1 is completed, as illustrated in FIG. 15, distance signal 20 is transferred in a reverse direction by one stage, and second distance signal accumulation period Ta2 is started. In second distance signal accumulation period Ta2, distance signal 21 is read by applying read pulse $\phi$V6 and emitting the infrared light, and distance signal 21 is accumulated in signal packet 16b.

Figure 16:
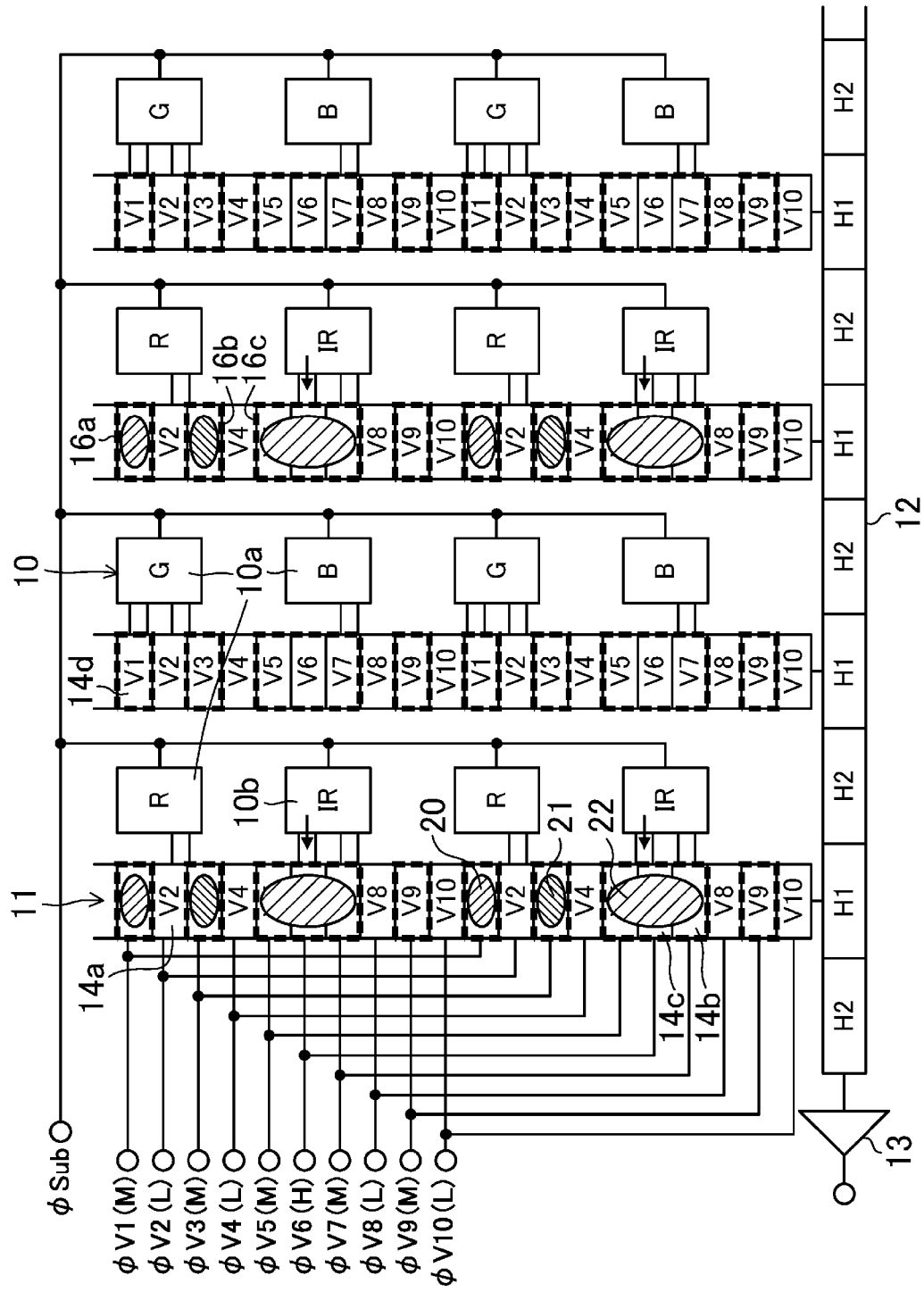
FIG. 16 is a plan view illustrating the operation of the solid state imaging device in FIG. 12 at another next timing.

If second distance signal accumulation period Ta2 is completed, as illustrated in FIG. 16, distance signal 20 and distance signal 21 as well as signal packets 16a and 16b are transferred in the reverse direction by one stage, and background light signal accumulation period Tb is started. In background light signal accumulation period Tb, after background light is exposed for a period of the same length as first distance signal accumulation period Ta1 and second distance signal accumulation period Ta2, background light signal 22 is read without emitting the infrared light, and applying read pulse $\phi$V6, and background light signal 22 is accumulated in signal packet 16c.

Figure 17:
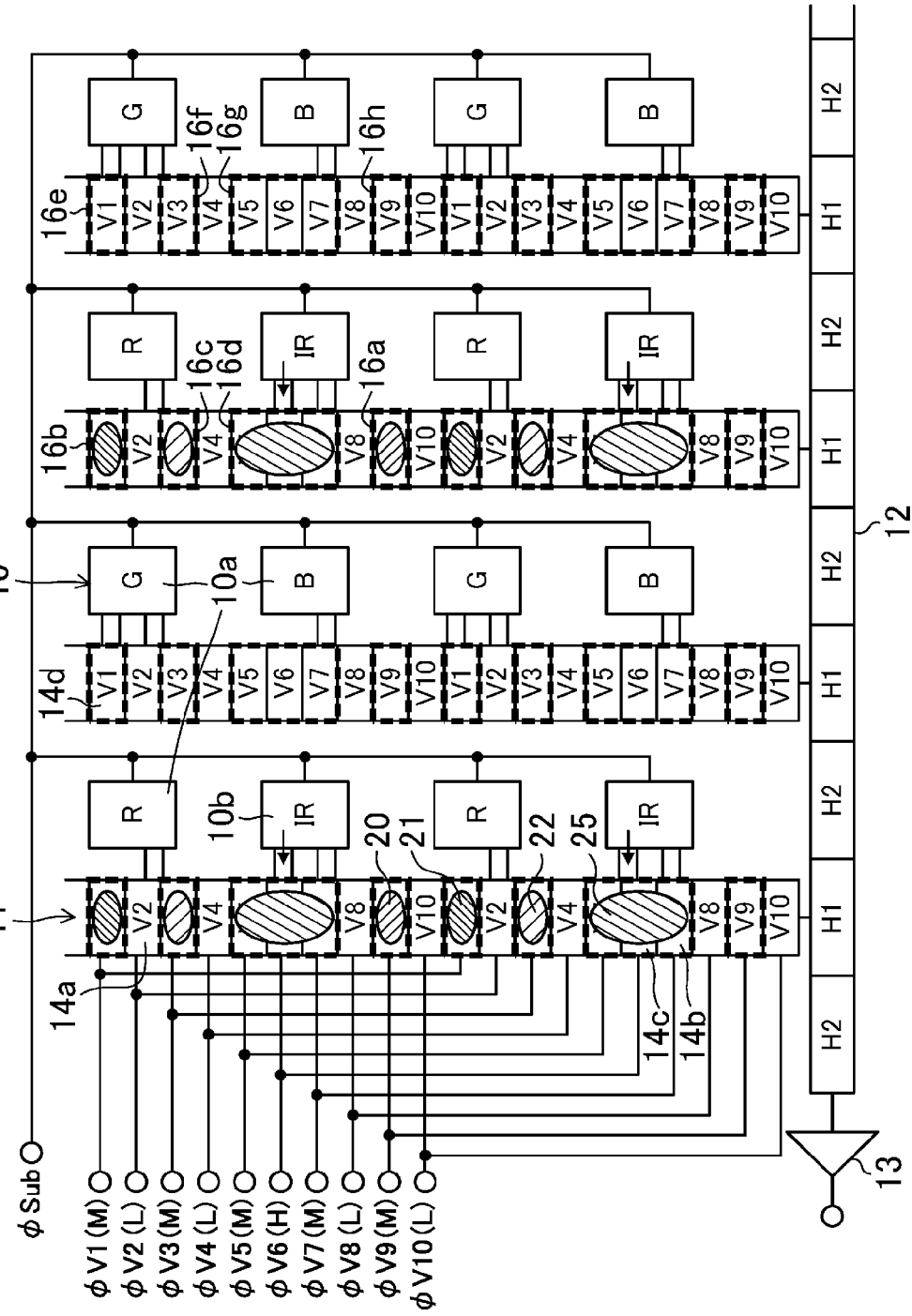
FIG. 17 is a plan view illustrating the operation of the solid state imaging device in FIG. 12 at still another next timing.

If background light signal accumulation period Tb is completed, as illustrated in FIG. 17, distance signal 20, distance signal 21, and background light signal 22 as well as signal packets 16a to 16c are transferred in the reverse direction by one stage, and third distance signal accumulation period Ta3 is started. In third distance signal accumulation period Ta3, distance signal 25 is read by emitting the infrared light at a timing different from in first distance signal accumulation period Ta1, and applying read pulse $\phi$V6, and distance signal 25 is accumulated in signal packet 16d.

In signal transfer period Te1, distance signal 20, distance signal 21, background light signal 22, and distance signal 25 are sequentially output by sequentially scanning vertical transfer unit 11 and horizontal transfer unit 12.

In this case, signal charges of all pixels are discharged by applying substrate discharge pulse $\phi$Sub at a certain timing. If the apply of substrate discharge pulse $\phi$Sub is ended, visible light signal 23 of photoelectric conversion unit 10a and visible light signal 24 of photoelectric conversion unit 10b are started to be accumulated in respective photoelectric conversion units.

Figure 18:
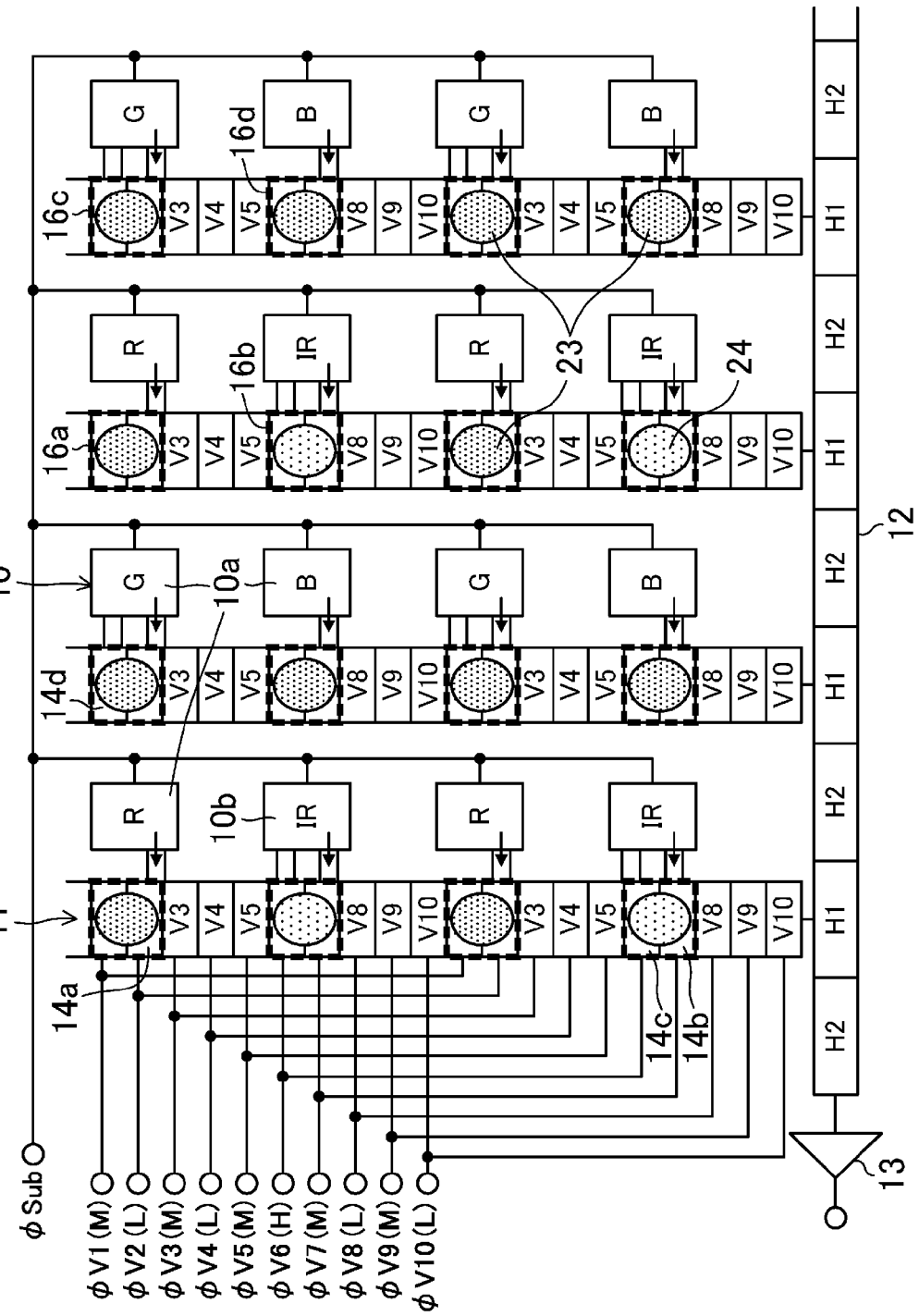
FIG. 18 is a plan view illustrating the operation of the solid state imaging device in FIG. 12 at still another next timing.

Next, visible light signal 23 and visible light signal 24 that have been accumulated by the exposure in signal transfer period Te1 in the previous frame are accumulated in signal packets 16a to 16d, by applying read pulses $\phi$V2 and $\phi$V6, at the beginning of an even frame, as illustrated in FIG. 18.

In signal transfer period Tc2, visible light signal 23 and visible light signal 24 are sequentially output by sequentially scanning vertical transfer unit 11 and horizontal transfer unit 12.

Figure 19:
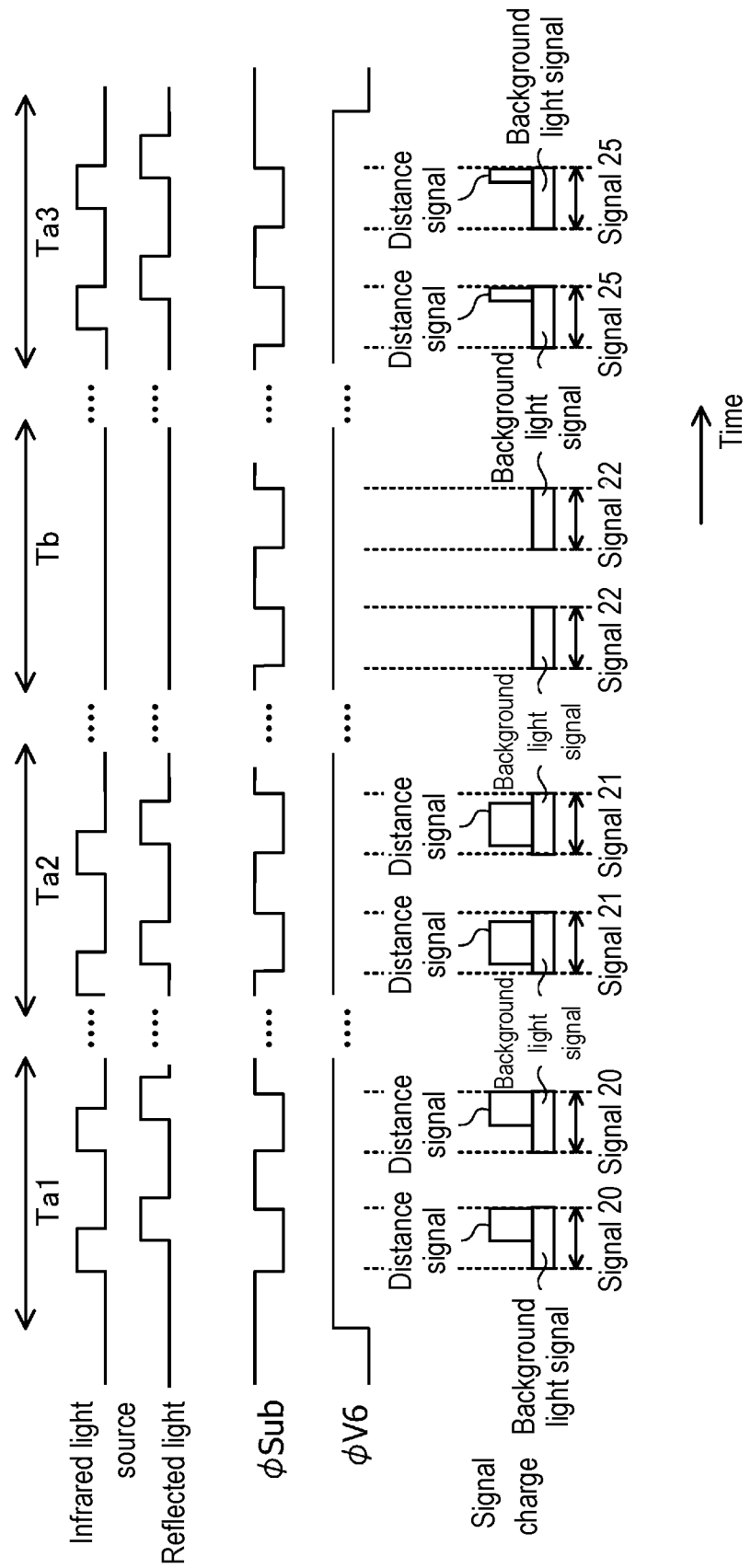
FIG. 19 is a timing chart illustrating a detailed operation of the solid state imaging device in FIG. 12 in a distance signal accumulation period.

FIG. 19 is a timing chart illustrating a detailed operation of the solid state imaging device in FIG. 13 in first, second, and third distance signal accumulation periods Ta1, Ta2, and Ta3, and background light signal accumulation period Tb. In first, second, and third distance signal accumulation periods Ta1, Ta2, and Ta3, and background light signal accumulation period Tb, when read pulse $\phi$V6 applied to vertical transfer electrode 14c is fixed to High level and substrate discharge pulse $\phi$Sub enters Low level, charges are accumulated.

First, background light components contained in distance signal 20, distance signal 21, and distance signal 25 are eliminated by using background light signal 22 in the generation of a distance image. Here, although distance signal 25 is increasing as compared with the first embodiment, it becomes possible to use properly distance signal in such a manner that for example, distance signal 20 is a signal suitable for calculating the long distance, and distance signal 25 is a signal suitable for calculating the short distance.

As described above, according to the TOF-type distance measurement system according to the third embodiment, it is possible to produce a distance image excluding influence of the background light, available from a short range to a long distance, in other words, a distance image of a wide dynamic range, by further increasing the number of drive phases of vertical transfer unit 11 provided in the solid state imaging device.

Furthermore, although not illustrated, even if vertical transfer unit 11 is ten-phase driven, driving handling only distance signals 20, 21, and 22 is possible without acquiring distance signal 25, but in this case, unlike FIG. 12, each signal packet can always be accumulated in two gates or more, such that as compared with the first embodiment and the second embodiment, the charge amount to be handled in one frame scanning period is increased, and improvement of distance accuracy is possible not only in driving handling four signals but also in driving handling three signals.

In addition, similar to the first embodiment, if photoelectric conversion unit 10b of infrared light is placed in a checkerboard pattern, and photoelectric conversion unit 10a of visible light is placed in remaining free pixels, it is possible to effectively utilize 16e to 16h that become free packets in FIG. 17, such that the fact in that the resolution of the distance image increases (not illustrated).

Figure 20:
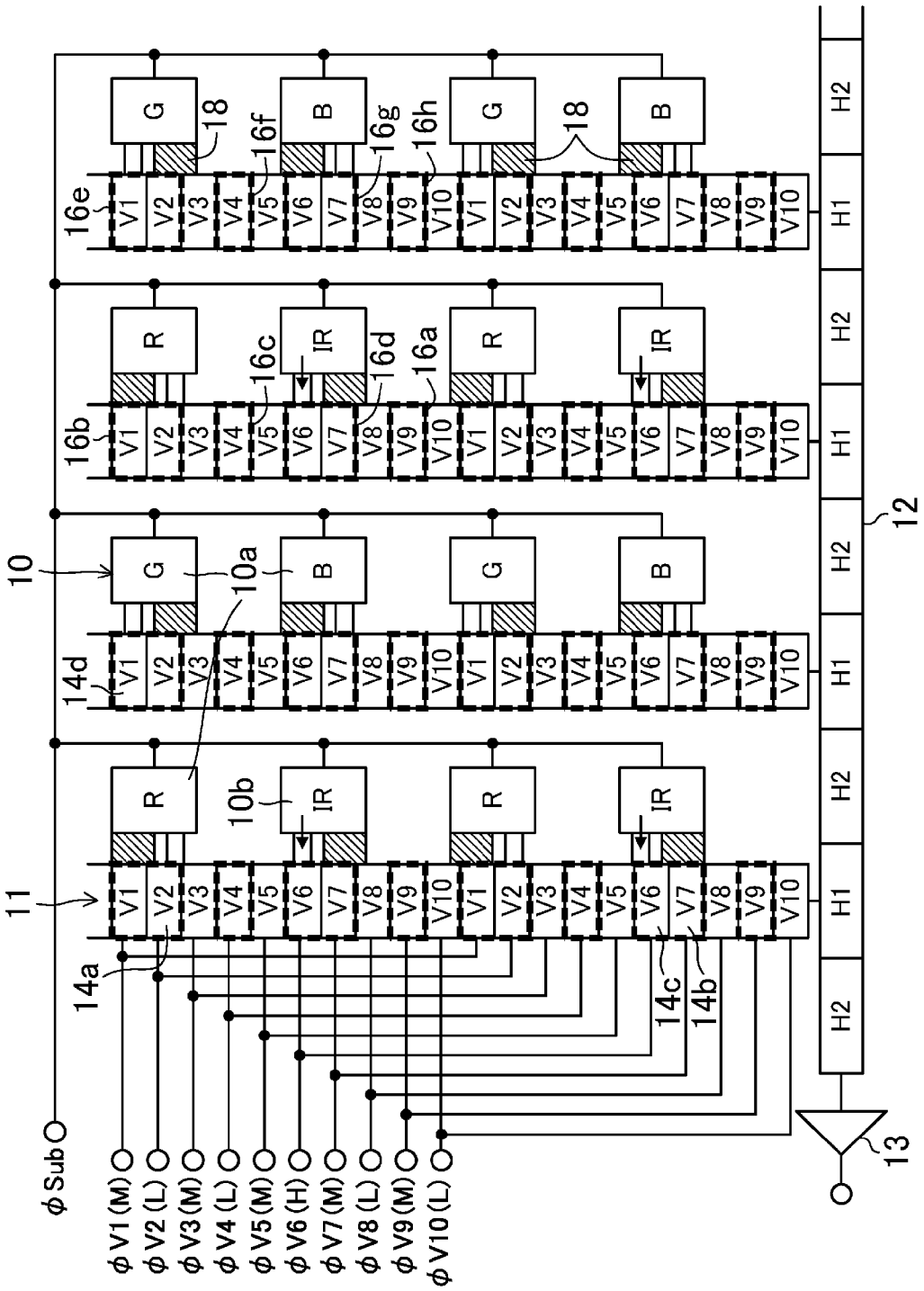
FIG. 20 is a plan view illustrating a configuration of another channel stop region of the third embodiment of the solid state imaging device in FIG. 1.

Similar to the second embodiment, the solid state imaging device of the present embodiment is configured to read only certain color, by providing channel stop region 18 such that read electrodes 14a and 14b are read only in a checkered pattern, as illustrated in FIG. 20.

Fourth Embodiment

Figure 21:
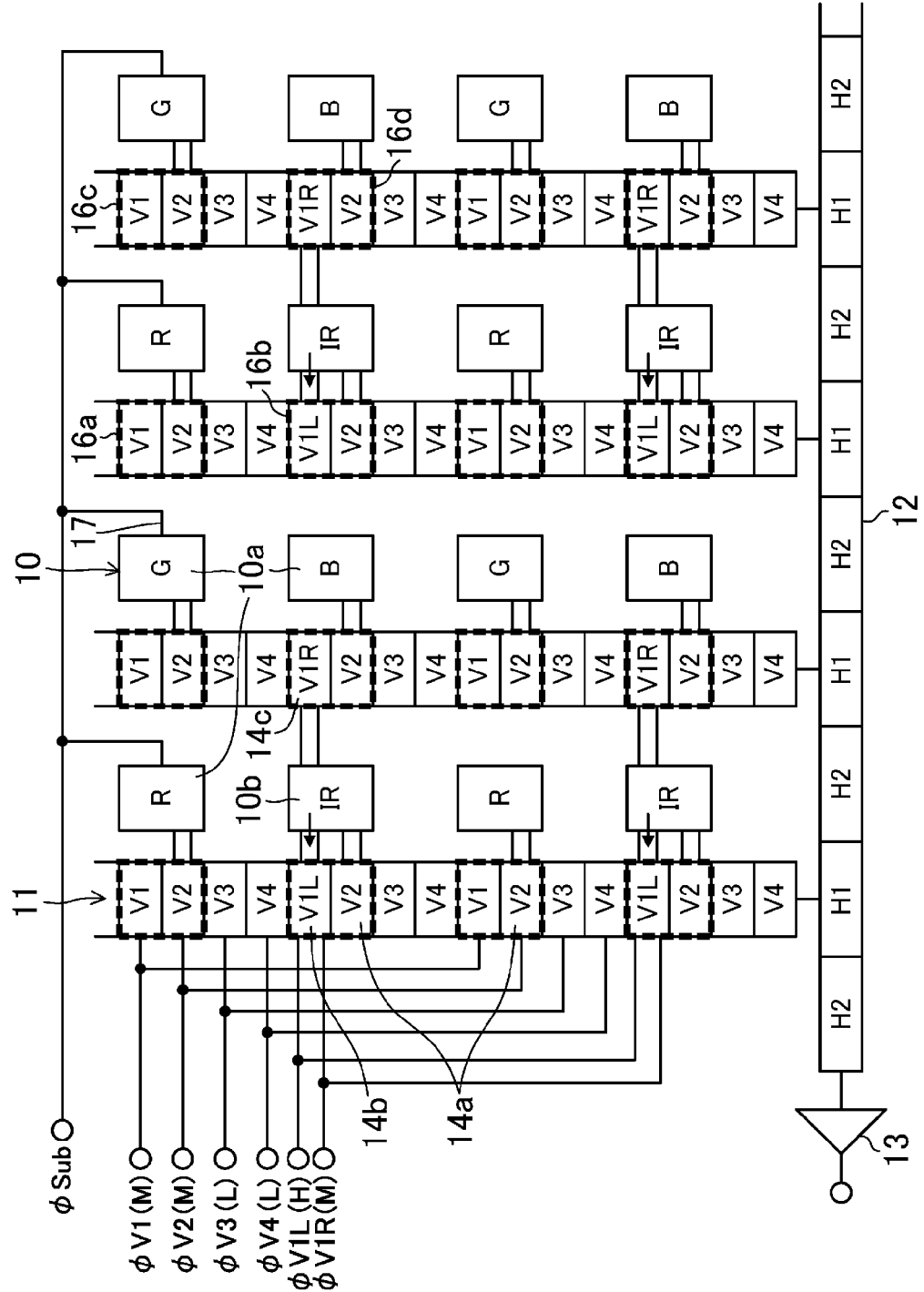
FIG. 21 is a plan view illustrating a fourth embodiment of the solid state imaging device in FIG. 1.

FIG. 21 is a plan view illustrating a fourth embodiment of solid state imaging device 105 in FIG. 1.

The solid state imaging device according to the fourth embodiment is different from the solid state imaging device according to the third embodiment in the configuration of vertical transfer unit 11. However, an object of providing a structure and a driving method capable of generating a distance image excluding influence of the background light in one frame scanning period, and obtaining a visible light image in a separate frame is the same as in the solid state imaging device according to the third embodiment. Hereinafter, a description will be made focusing portions different from the third embodiment, and the description regarding the same portions will be omitted.

The solid state imaging device illustrated in FIG. 21, as compared with the solid state imaging device in FIG. 12, vertical transfer unit 11 is a simple four-phase drive in which vertical transfer electrode 14 has four gates per one pixel. However, read electrode 14b (V1L gate in FIG. 21) and read electrode 14c (V1R gate in FIG. 21) are disposed so as to be able to apply different ϕV1 pulses in vertical transfer unit 11 on both sides of photoelectric conversion unit 10b that converts infrared light into signal charges, and are configured to read also from vertical transfer unit 11 in any position on the both sides of photoelectric conversion unit 10b, by selectively using read pulses ϕV1L and ϕV1R applied to read electrodes 14b and 14c. It should be noted that, for convenience to indicate the configuration of the read electrode, which is a feature of the present embodiment, VSub electrode 17 is depicted so as not to be connected only with the photodiode on the top, but in fact, similar to the first and third embodiments, each photoelectric conversion unit 10 is provided with a vertical overflow drain, and it is possible to discharge signal charges of all photoelectric conversion units 10, by applying ϕSub pulse at an arbitrary timing.

Figure 22:
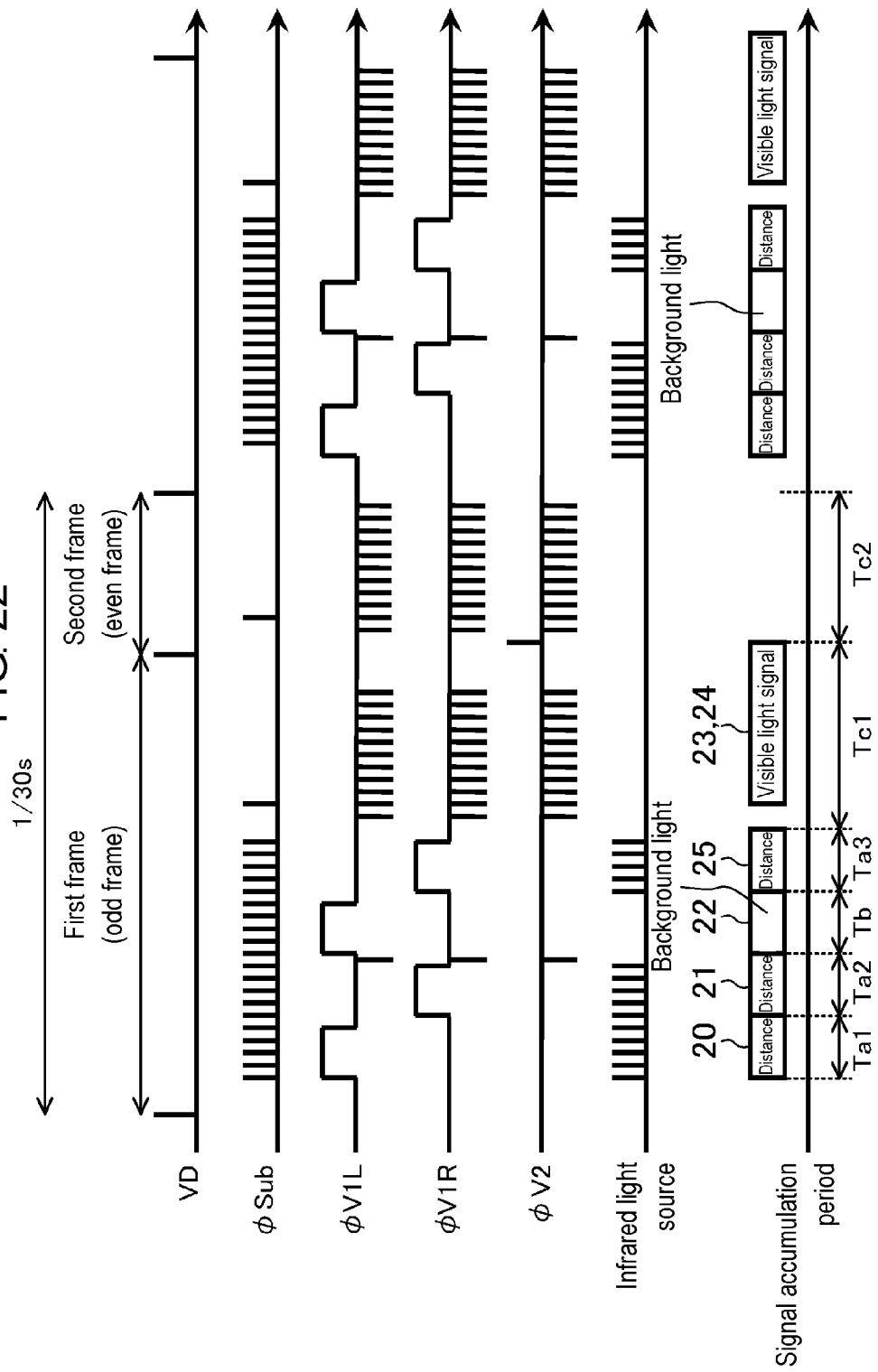
FIG. 22 is a timing chart illustrating a schematic operation of the solid state imaging device in FIG. 21.

FIG. 22 is a timing chart illustrating a schematic operation of the solid state imaging device in FIG. 21, and similar to FIG. 13 that is a timing chart illustrating a schematic operation of the solid state imaging device in FIG. 12, but has a difference in the number of drive phases, and thus electrodes to which read pulses are applied are different. As compared to the third embodiment, the fourth embodiment is characterized in that the number of transfer of signals when acquiring a distance signal (in an odd frame) is reduced, and the number of signal packets is small.

FIGS. 23 to 27 are plan views illustrating an operation of the solid state imaging device in FIG. 21 at respective timings.

Figure 23:
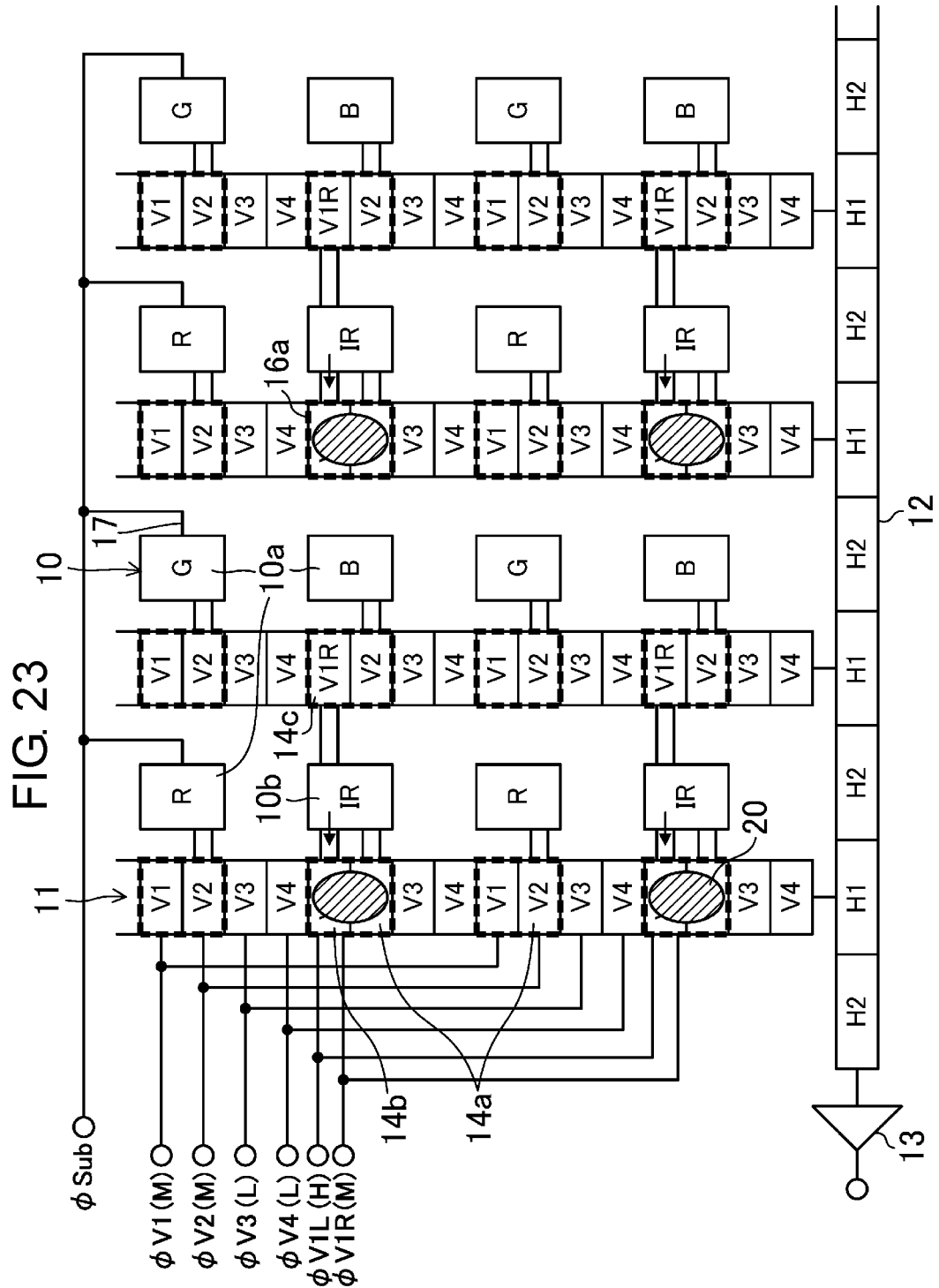
FIG. 23 is a plan view illustrating an operation of the solid state imaging device in FIG. 21 at a certain timing.
Figure 24:
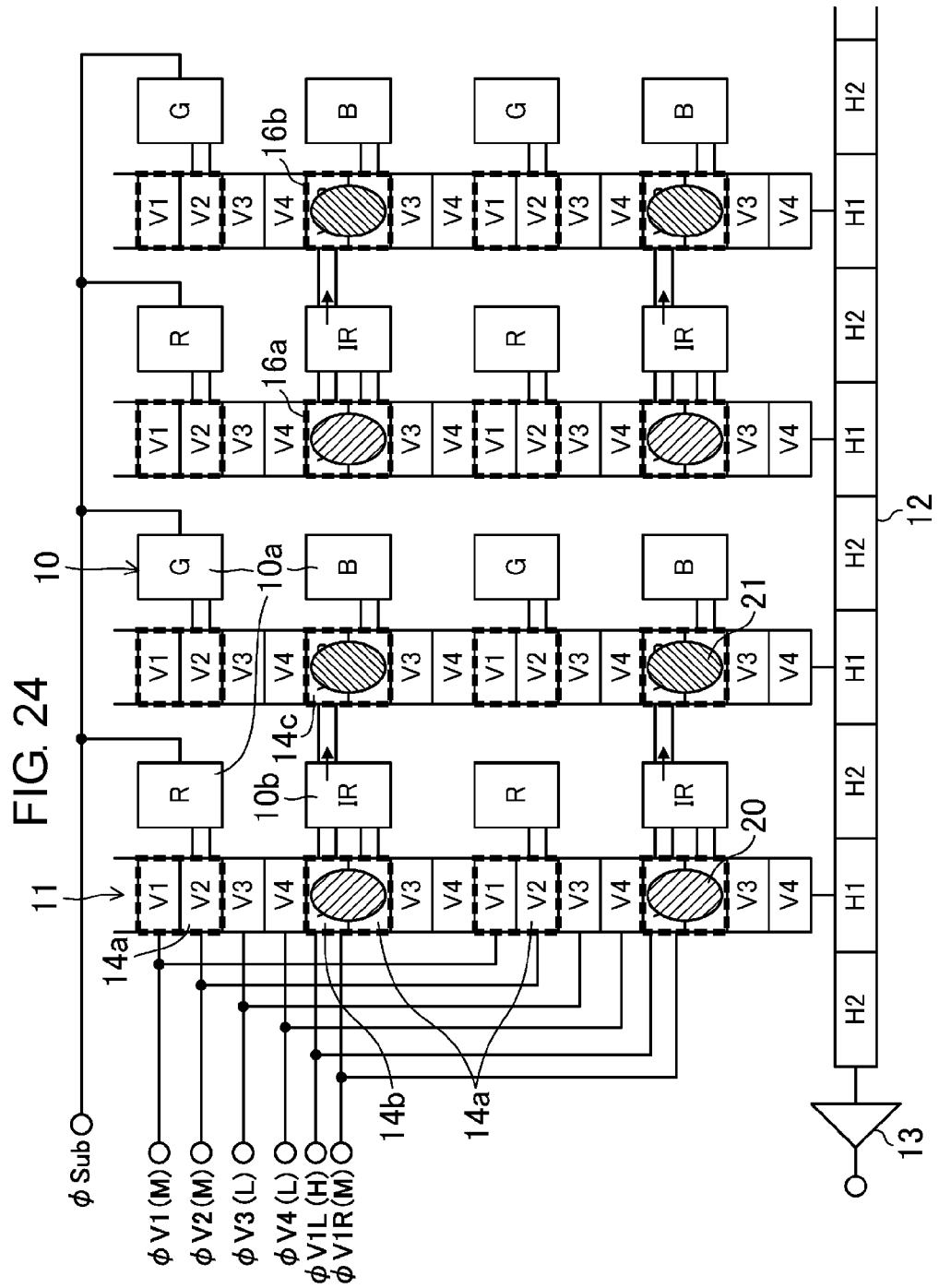
FIG. 24 is a plan view illustrating the operation of the solid state imaging device in FIG. 21 at the next timing.

First, first distance signal accumulation period Ta1 is started at the beginning of an odd frame. In first distance signal accumulation period Ta1, distance signal 20 is read to vertical transfer unit 11 on the left side in FIG. 23 of photoelectric conversion unit 10b, by applying read pulse ϕV1L, and emitting the infrared light, as illustrated in FIG. 23, and distance signal 20 is accumulated in signal packet 16a.

If first distance signal accumulation period Ta1 is completed, distance signal 20 remains as it is, and second distance signal accumulation period Ta2 is started. In second distance signal accumulation period Ta2, distance signal 21 is read to vertical transfer unit 11 on the center side in FIG. 23 of photoelectric conversion unit 10b, by applying read pulse ϕV1R, and emitting the infrared light, and distance signal 21 is accumulated in signal packet 16b on the opposite side to signal packet 16a through photoelectric conversion unit 10b.

Figure 25:
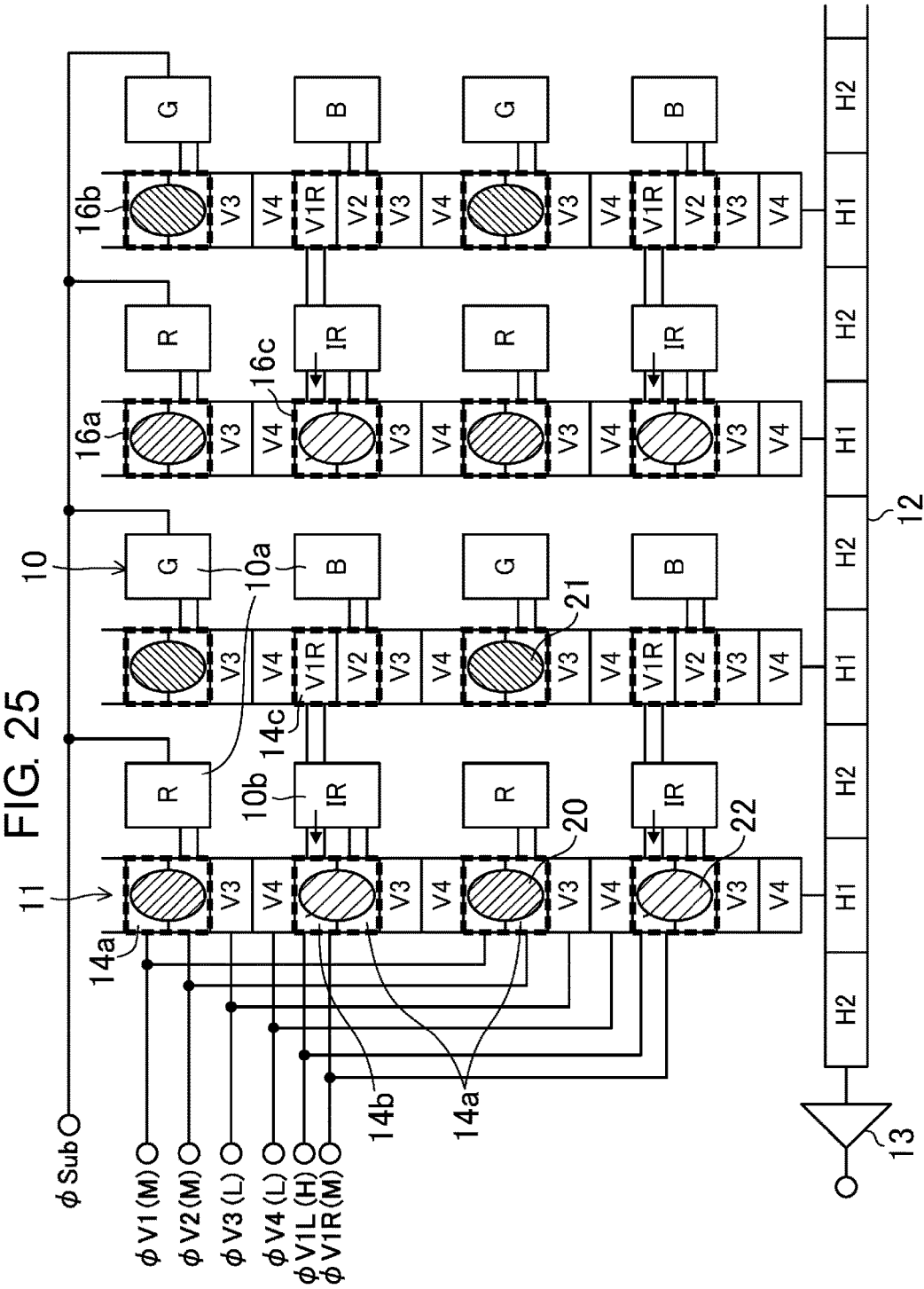
FIG. 25 is a plan view illustrating the operation of the solid state imaging device in FIG. 21 at another next timing.

If second distance signal accumulation period Ta2 is completed, as illustrated in FIG. 25, distance signal 20 and distance signal 21 as well as signal packets 16a and 16b are transferred in the reverse direction by one stage, and background light signal accumulation period Tb is started. In background light signal accumulation period Tb, after background light is exposed for a period of the same length as first distance signal accumulation period Ta1 and second distance signal accumulation period Ta2, background light signal 22 is read to vertical transfer unit 11 on the left side in FIG. 25 of photoelectric conversion unit 10b, by applying read pulse ϕV1L, without emitting the infrared light, and background light signal 22 is accumulated in signal packet 16e.

Figure 26:
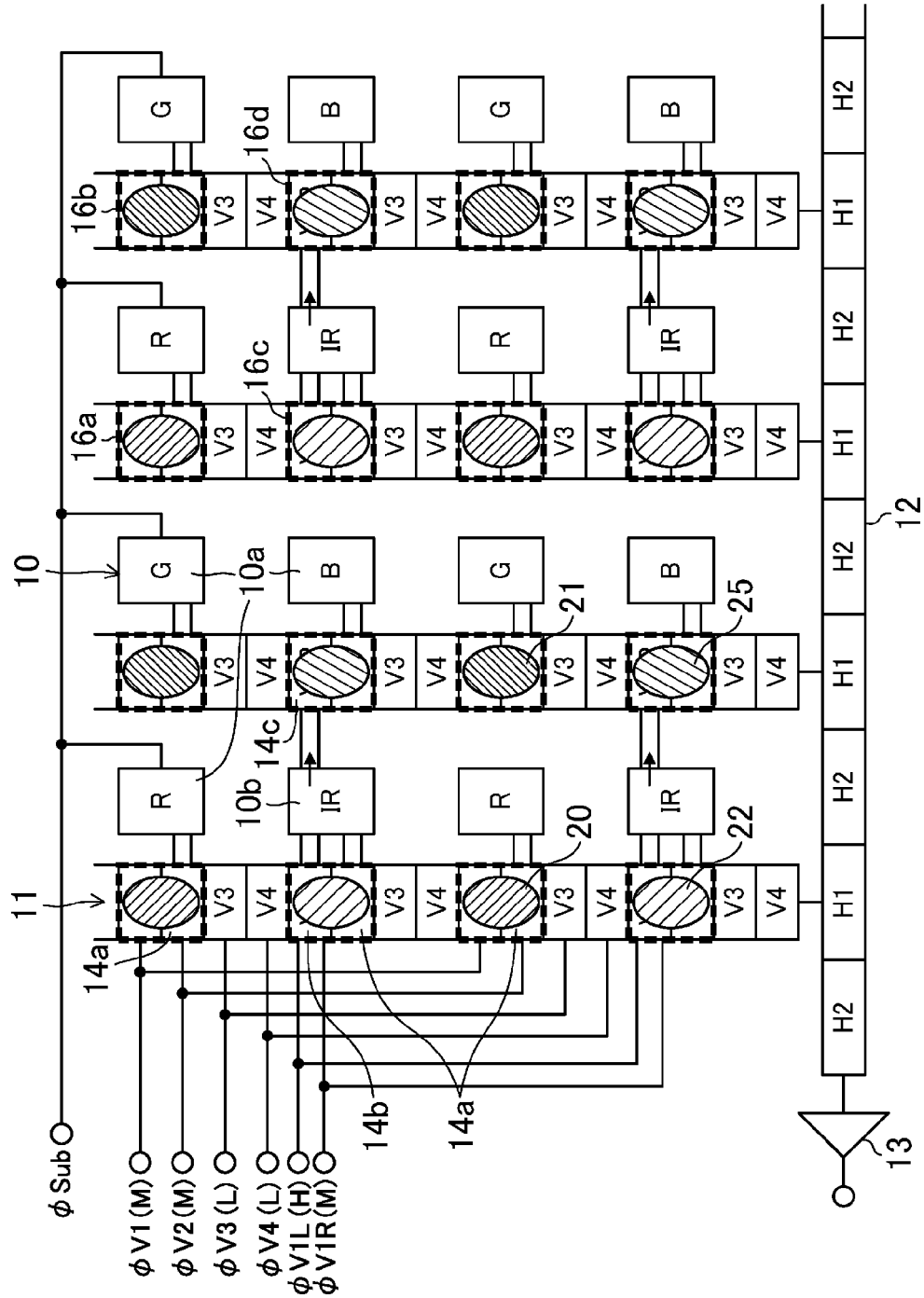
FIG. 26 is a plan view illustrating the operation of the solid state imaging device in FIG. 21 at still another next timing.

If background light signal accumulation period Tb is completed, as illustrated in FIG. 26, distance signal 20, distance signal 21, and background light signal 22 remains as it is, and third distance signal accumulation period Ta3 is started. In third distance signal accumulation period Ta3, distance signal 25 is read to vertical transfer unit 11 on the right side in FIG. 26 of photoelectric conversion unit 10b, by emitting the infrared light at a timing different from in first distance signal accumulation period Ta1, and applying read pulse ϕV1R after exposure, and distance signal 25 is accumulated in signal packet 16d on the opposite side to signal packet 16c through photoelectric conversion unit 10b.

In signal transfer period Tel, distance signal 20, distance signal 21, background light signal 22, and distance signal 25 are sequentially output by sequentially scanning vertical transfer unit 11 and horizontal transfer unit 12.

In this case, signal charges of all pixels are discharged by applying substrate discharge pulse ϕSub at a certain timing. If the apply of substrate discharge pulse ϕSub is ended, visible light signal 23 of photoelectric conversion unit 10a and visible light signal 24 of photoelectric conversion unit 10b are started to be accumulated in respective photoelectric conversion units.

Figure 27:
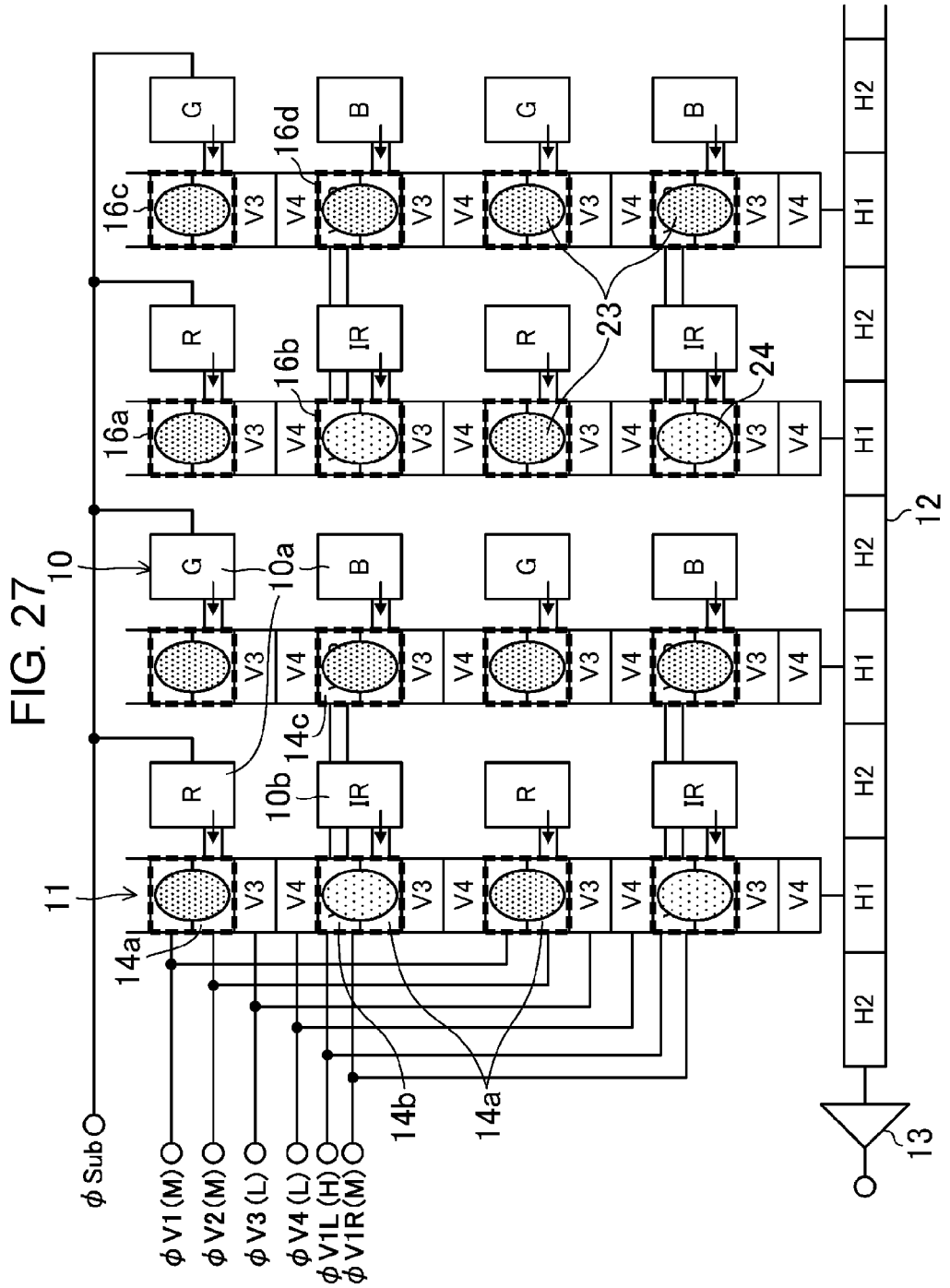
FIG. 27 is a plan view illustrating the operation of the solid state imaging device in FIG. 21 at still another next timing.

Visible light signal 23 and visible light signal 24 that have been accumulated by the exposure in signal transfer period Tel in the previous frame are accumulated in signal packets 16a to 16d, by applying read pulse φV2, at the beginning of the second frame, as illustrated in FIG. 27.

In signal transfer period Tc2, visible light signal 23 and visible light signal 24 are sequentially output by sequentially scanning vertical transfer unit 11 and horizontal transfer unit 12.

As described above, according to the TOF-type distance measurement system according to the fourth embodiment, it is possible to widen the dynamic range of a distance image excluding influence of the background light, similar to the third embodiment, without increasing the number of drive phases of vertical transfer unit 11 provided in the solid state imaging device.

As illustrated in FIGS. 23 to 27, since distance signals 20, 21, 22, 25 can basically be accumulated in two gates, as compared with the first embodiment and the second embodiment, the charge amount to be handled in one frame scanning period is increased, and improvement of distance accuracy is possible.

Incidentally, according to the structure according to the fourth embodiment, it is also possible to easily cope with the construction of the TOF-type distance measurement system using a phase difference method. The phase difference method is a method of flashing the infrared light to be emitted at a high speed, and measuring the degree of phase delay of the reflected light. For example, FIG. 28 illustrates an example of the drive timing.

Figure 28:
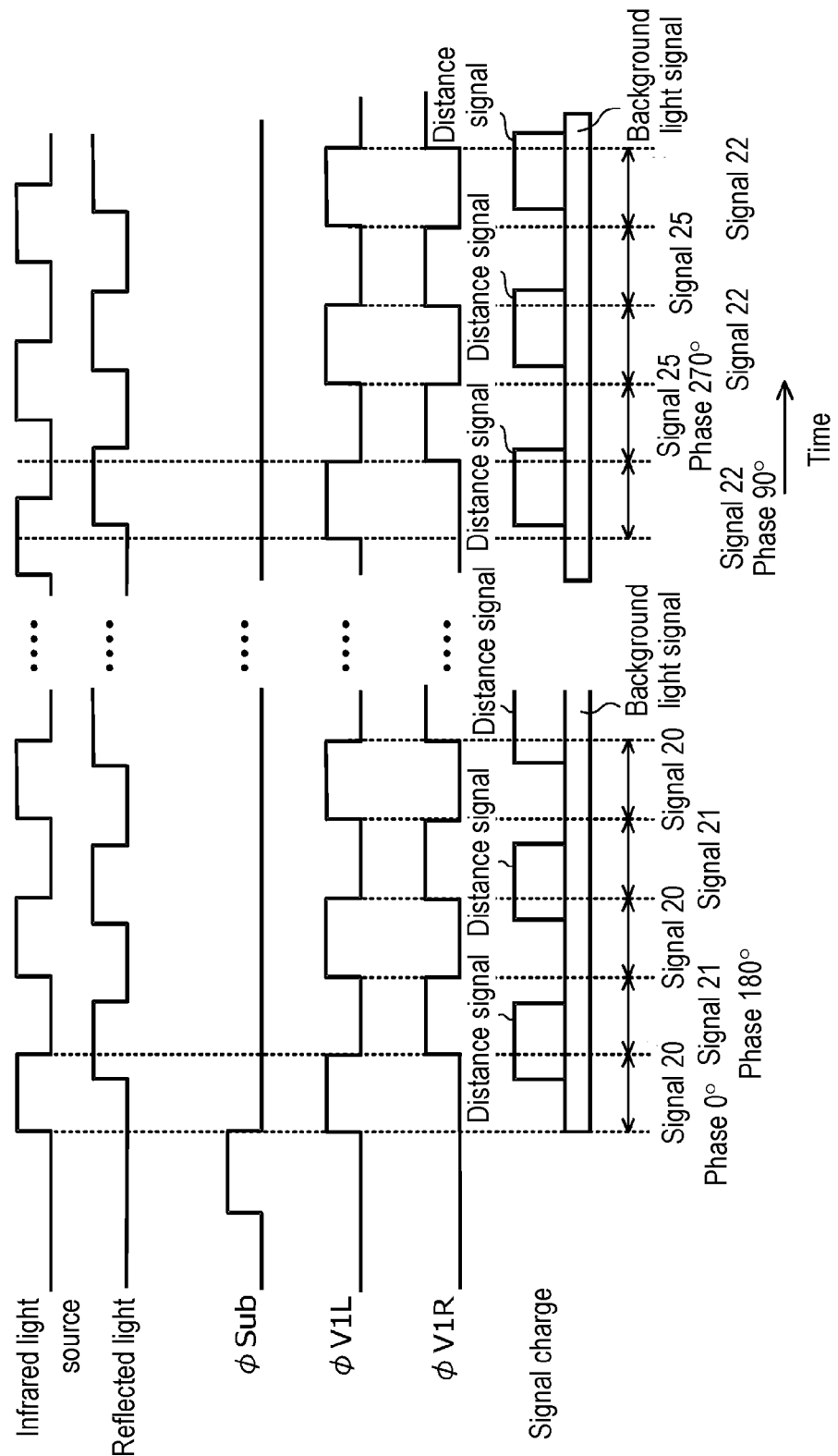
FIG. 28 is a timing chart illustrating a detailed operation of the solid state imaging device in FIG. 21 in a distance signal accumulation period.

Unlike the first embodiment and the third embodiment, since two read electrodes (V1L, V1R) are present in photoelectric conversion unit 10b that converts infrared light into signal charges, it is possible to read out the 180-degree phase inverted signals alternately in different signal packets in the first frame for outputting a distance image, as illustrated in FIG. 28. Thereafter, since two signals which are shifted from the previous phase by 90 degrees are further obtained, it is possible to calculate the distance from four signals having different phases.

In this case, the process of obtaining a visible image in the second frame is the same as those presented in the present embodiment.

As it has been described above, the imaging device according to the present disclosure is useful as imaging device that obtains the distance image of the object present in a predetermined distance position and a visible light image, by improving the distance accuracy and the frame rate of the moving object.

What is claimed is:

1. A solid state imaging device in an imaging device including an infrared light source that emits infrared light and a solid state imaging device, the solid state imaging device comprising:
   a plurality of first pixels and a plurality of second pixels, which respectively include vertical overflow drains, and are arranged in a matrix on a semiconductor substrate, the plurality of first pixels converting the infrared light into signal charges, and the plurality of second pixels converting visible light into signal charges,
   wherein the solid state imaging device
      outputs a first signal obtained from the plurality of first pixels in an irradiation period of infrared lightby the infrared light source, and a second signal obtained from the plurality of first pixels in a non-irradiation period of infrared lightby the infrared light source, in a first frame scanning period, and
      outputs a third signal obtained from the plurality of first pixels and a fourth signal obtained from the plurality of second pixels in a second frame scanning period.

2. The solid state imaging device of claim 1, further comprising:
   a vertical transfer unit that transfers the signal charges of the plurality of first pixels and the signal charges of the plurality of second pixels; and
   an output unit that amplifies and outputs the transferred signal charges as signals.

3. The solid state imaging device of claim 2, wherein the vertical transfer unit is eight-phase driven.

4. The solid state imaging device of claim 2, wherein the vertical transfer unit is ten-phase driven.

5. The solid state imaging device of claim 2, wherein two or more read electrodes for reading out the signal charges to the vertical transfer unit are provided in at least the plurality of first pixels.

6. The solid state imaging device of claim 2, wherein the plurality of first pixels and the plurality of second pixels, with four pixels as a unit, read out the signal charges from read electrodes independent of each other to the vertical transfer unit.

7. The solid state imaging device of claim 2, wherein the vertical transfer unit is four-phase driven, and wherein the plurality of first pixels also selectively read out the signal charges to any one of two adjacent vertical transfer units.

8. The solid state imaging device of claim 1, wherein the plurality of second pixels include three types of pixels of a blue pixel for receiving blue color, a green pixel for receiving green color, and a red pixel for receiving red color.

9. The solid state imaging device of claim 1, wherein the plurality of second pixels includes four types of pixels of a yellow pixel for receiving yellow color, a cyan pixel for receiving cyan color, a green pixel for receiving green color, and a magenta pixel for receiving magenta color, or any three types of pixels among the four types of pixels.

10. An imaging device comprising:
    an infrared light source that emits infrared light; and
    a solid state imaging device including a plurality of first pixels and a plurality of second pixels, which respectively include vertical overflow drains, and are arranged in a matrix on a semiconductor substrate, the plurality of first pixels converting the infrared light into signal charges, and the plurality of second pixels converting visible light into signal charges,
    wherein the solid state imaging device
       outputs a first signal obtained from the plurality of first pixels in an irradiation period of infrared light by the infrared light source, and a second signal obtained from the plurality of first pixels in a non-irradiation period of infrared light by the infrared light source in a first frame scanning period, and
       outputs a third signal obtained from the plurality of first pixels and a fourth signal obtained from the plurality of second pixels in a second frame scanning period.

11. The imaging device of claim 10, wherein the imaging device is as a TOF (Time Of Flight)-type distance measuring sensor that generates two or more distance signals as the first signal, in each of the plurality of first pixels, from reflected light that is received in two different periods, by emitting the infrared light in a pulse form, and irradiating a space including an object with the emitted infrared light, removes a background light component, in each difference between the two or more distance signals and the second signal generated in the non-irradiation period of the infrared light by the infrared light source, and obtains a distance to the object based on a ratio of two distance signals among two or more distance signals.

12. The imaging device of claim 10,
wherein the imaging device is a structured light distance measuring sensor that generates the first signal by irradiating a space including an object with the infrared light in a specific pattern, removes a background light component by using a difference between the first signal and the second signal generated in the non-irradiation period of the infrared light by the infrared light, and obtains a distance to the object by a position deviation amount of each illumination pattern.

13. The imaging device of claim 10,
wherein the imaging device is a stereo-type distance measuring sensor that generates the first signal by irradiating a space including an object with the infrared light, removes a background light component by using a difference between the first signal and the second signal generated in the non-irradiation period of the infrared light by the infrared light source, and obtains a distance to the object by a triangulation method.

14. A driving method of an imaging device including an infrared light source that emits infrared light, and a solid state imaging device including a plurality of first pixels and a plurality of second pixels, which respectively include vertical overflow drains and are arranged in a matrix on a semiconductor substrate, the plurality of first pixels converting the infrared light into signal charges, and the plurality of second pixels converting visible light into signal charges, the method comprising:
- a step of obtaining a first signal from the plurality of first pixels in an irradiation period of infrared light by the infrared light source;
- a step of obtaining a second signal from the plurality of first pixels in a non-irradiation period of infrared light by the infrared light source;
- a step of outputting the first and second signals in a first frame scanning period;
- a step of obtaining a third signal from the plurality of first pixels;
- a step of obtaining a fourth signal from the plurality of second pixels; and
- a step of outputting the third and fourth signals in a second frame scanning period.

* * * * *